(12) United States Patent
Offermann

(10) Patent No.: US 10,942,227 B2
(45) Date of Patent: Mar. 9, 2021

(54) DUAL SENSOR ASSEMBLY AND METHOD OF FABRICATION

(71) Applicant: NXP B.V., Eindhoven (NL)

(72) Inventor: Bernd Offermann, Hamburg (DE)

(73) Assignee: NXP B.V., Eindhoven (NL)

( * ) Notice: Subject to any disclaimer, the term of this patent is extended or adjusted under 35 U.S.C. 154(b) by 59 days.

(21) Appl. No.: 16/451,281

(22) Filed: Jun. 25, 2019

(65) Prior Publication Data

US 2020/0408854 A1  Dec. 31, 2020

(51) Int. Cl.
*G01R 33/00* (2006.01)

(52) U.S. Cl.
CPC .................. *G01R 33/0047* (2013.01)

(58) Field of Classification Search
None
See application file for complete search history.

(56) References Cited

U.S. PATENT DOCUMENTS

| 2007/0187869 | A1 | 8/2007 | Bierslaker et al. |
| 2010/0141249 | A1* | 6/2010 | Ararao ............ H01L 43/02 324/244 |
| 2016/0018476 | A1* | 1/2016 | Ooi ............ G01R 33/0052 324/207.13 |
| 2018/0024156 | A1* | 1/2018 | Welsch ............ G01P 3/487 123/406.61 |
| 2020/0318995 | A1* | 10/2020 | Imahori ............ G01R 33/07 |

FOREIGN PATENT DOCUMENTS

DE  10 201 5 224 225 A1  6/2017
WO  WO-2019/224167 A2  11/2019

OTHER PUBLICATIONS

U.S. Appl. No. 16/247,827; not yet published; 25 pages (filed Jan. 15, 2019).

* cited by examiner

*Primary Examiner* — Jas A Sanghera

(74) *Attorney, Agent, or Firm* — Charlene R. Jacobsen

(57) ABSTRACT

A sensor assembly includes first and second sensor packages adjacent to one another and directly overmolded with an overmold material without being attached to a carrier structure. The first sensor package includes a first sensor die, a first set of connector pins electrically connected to the first sensor die, a first housing in which the first sensor die is located, the first housing having first and second surfaces spaced apart from one, and a first component positioned in proximity to the second surface of the first housing. The second sensor package includes a second sensor die, a second set of connector pins electrically connected to the second sensor die, a second housing in which the second sensor die is located, the second housing having third and fourth surfaces spaced apart from one another, and a second component positioned in proximity to the fourth surface of the second housing.

18 Claims, 13 Drawing Sheets

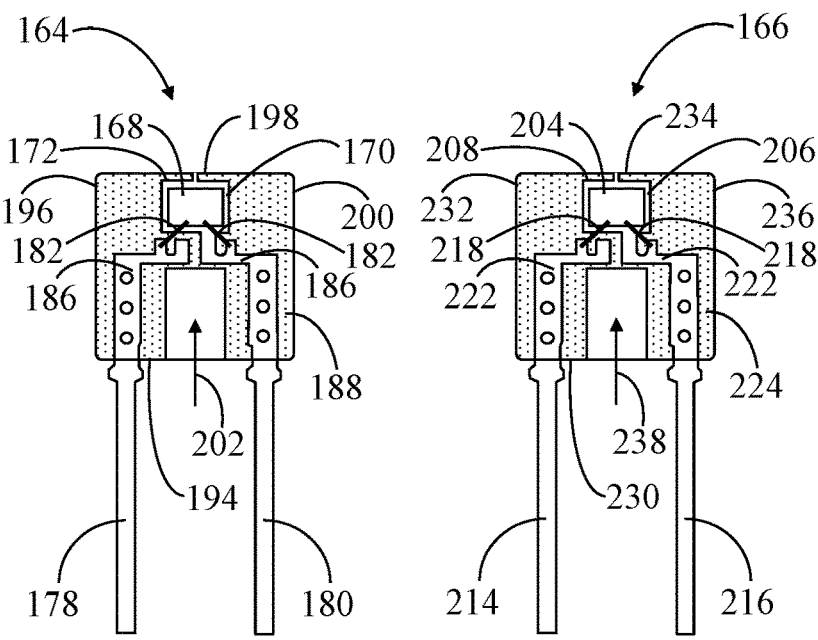
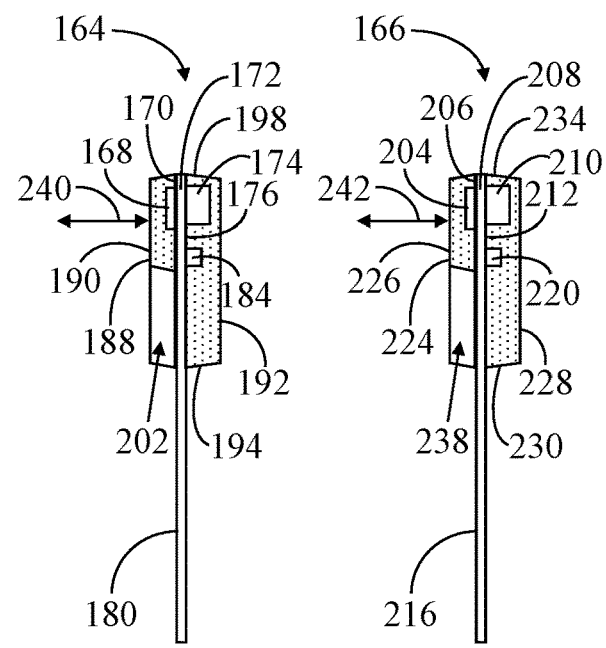
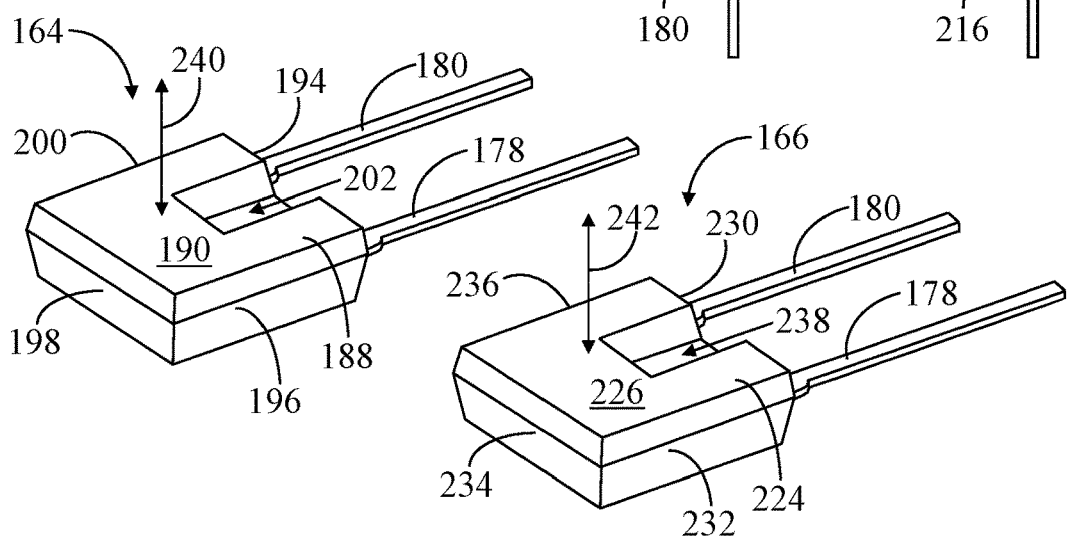
FIG. 18
FIG. 19
FIG. 20

DUAL SENSOR ASSEMBLY AND METHOD OF FABRICATION

TECHNICAL FIELD OF THE INVENTION

The present invention relates generally to sensor assemblies. More specifically, the present invention relates to dual sensor assemblies and a methodology for fabricating dual sensor assemblies.

BACKGROUND OF THE INVENTION

Sensors are widely used in automotive, airplane and aerospace, manufacturing and machinery, medicine, robotics, and many other applications. A sensor package may include the sensing device, as well as associated electrical components integrated as a single package and encapsulated in an encapsulating material. Insulation of the sensor package, connection structures, and mechanical components is sometimes achieved by an injection molding process, also referred to as overmolding. To retain the sensor package in position within a mold cavity of a mold tool during the overmolding process, a separate support (alternatively referred to as a carrier, inlay, and the like) may be used. This support is thus overmolded with an overmold material (e.g., a thermoplastic or thermosetting polymer) along with the sensor package. As such, the support remains part of a sensor assembly. This separate support increases the complexity and, commensurately, the cost of a sensor assembly. Further, delamination can occur between the support and the overmold material thereby potentially enabling external contaminants into the sensor assembly and decreasing the reliability of such a sensor assembly, especially in harsh operational environments.

Requirements are increasingly calling for redundant sensor systems in safety critical applications. For example, an anti-lock braking system uses sensors (such as magnetic field sensors) to monitor the wheel speed. The wheel speed information may be sent to a controller which uses this information to prevent the brakes from locking during a stop. Using redundant sensors to monitor the same wheel speed may more accurately produce information to be interpreted by the computer. Alternatively, should one of the sensors fail, the other sensor may be used to monitor the wheel speed. Given the safety critical nature of such a sensor system, accurate placement of two redundant sensors that sense along the same sensing axis is critical for detection of the physical stimulus (e.g., wheel speed) by both sensors. Further, secure retention of the redundant sensors during the overmolding process is particularly difficult, while concurrently achieving a compact dual sensor assembly.

SUMMARY

Aspects of the disclosure are defined in the accompanying claims.

In a first aspect, there is provided a sensor assembly comprising a first sensor package that includes a first sensor die, a first set of connector pins electrically connected to the first sensor die, a first housing in which the first sensor die is located, the first housing having first and second surfaces spaced apart from one another by first, second, third, and fourth sidewalls, and a first component positioned in proximity to the second surface of the first housing. The sensor assembly further comprises a second sensor package adjacent to the first sensor package, the second sensor package including a second sensor die, a second set of connector pins electrically connected to the second sensor die, a second housing in which the second sensor die is located, the second housing having third and fourth surfaces spaced apart from one another by fifth, sixth, seventh, and eighth sidewalls, and a second component positioned in proximity to the fourth surface of the second housing. An overmold material is overmolded about the first and second sensor packages to form the sensor assembly.

In a second aspect, there is provided a method for forming a sensor assembly comprising retaining a first sensor package in a cavity of a mold tool, the retaining the first sensor package comprising receiving the first sensor package in a first notch region extending into an alignment bar of an alignment tool, retaining a second sensor package in the cavity of the mold tool, the retaining the second sensor package comprising receiving the second sensor package in a second notch region extending into the alignment bar of the alignment tool, wherein the retaining the first and second sensor packages includes arranging the first and second sensor packages side-by-side such that their sensing axes are laterally displaced from one another and extend parallel to one another, and performing an overmolding process to fill the cavity with an overmold material to form the sensor assembly, wherein the alignment bar is configured to hold the first and second sensor packages in the mold tool during the overmolding process such that the first and second sensor packages are directly overmolded with the overmold material without being attached to a carrier structure.

In a third aspect, there is provided a method for forming a sensor assembly comprising retaining a first sensor package in a cavity of a mold tool utilizing an alignment tool, the retaining the first sensor package including receiving a first alignment bar of the alignment tool in a first notch region extending into a first surface of a first housing of the first sensor package, retaining a second sensor package in the cavity of the mold tool, the retaining the second sensor package including receiving a second alignment bar of the alignment tool in a second notch region extending into a second surface of a second housing of the second sensor package, wherein the retaining the first and second sensor packages includes arranging the first and second sensor packages side-by-side such that their sensing axes are laterally displaced from one another and extend parallel to one another, and performing an overmolding process to fill the cavity with an overmold material to form the sensor assembly, wherein the first and second alignment bars are configured to hold the first and second sensor packages in the mold tool during the overmolding process such that the first and second sensor packages are directly overmolded with the overmold material without being attached to a carrier structure.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 18 shows a plan view of redundant sensor packages in accordance with another embodiment;

FIG. 19 shows a side view of the sensor packages of FIG. 18;

FIG. 20 shows a perspective view of the redundant sensor packages of FIG. 18;

DETAILED DESCRIPTION

In overview, the present disclosure concerns redundant sensor packages, dual sensor assemblies, and methodology for fabricating the sensor assemblies using a direct overmolding technique that does not require overmolding a support into the dual sensor assembly (e.g., forming a premolded support). In some embodiments, an alignment bar of an alignment tool includes a pair of notch regions in which the redundant sensor packages are seated during an overmolding process in a mold tool. In other embodiments, each of the sensor packages includes a notch region deep enough to accommodate an alignment bar of an alignment tool used with the mold tool. In either configuration, the redundant sensor packages may be held securely during the overmolding process, while ensuring that the sensitive area of each of the sensor packages (e.g., the reading point of the sensors) is close to the surface of the overmolded sensor assembly and the sensing axes of the sensor packages are laterally displaced from one another and extend parallel to one another. Further, the sensor package may be equipped with connector pins that may be connected with conductors of an electrically conductive structure, such as a rigid frame or a cable. This connection junction may also be overmolded with the overmold material for protection of the connection junction from an external environment. The various inventive concepts and principles embodied in the redundant sensor packages, sensor assemblies, and method of fabrication may thus enable improved fabrication and cost efficiency, as well as compact size and enhanced sensor reliability in a redundant sensor configuration.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. Furthermore, some of the figures may be illustrated using various shading and/or hatching to more clearly distinguish the different components from one another.

Figure 1:
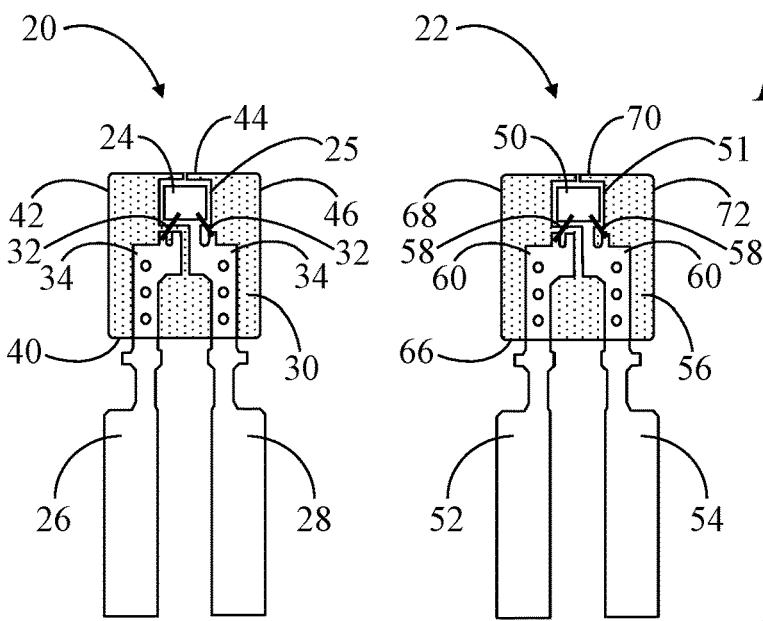
FIG. 1 shows a plan view of redundant sensor packages.
Figure 2:
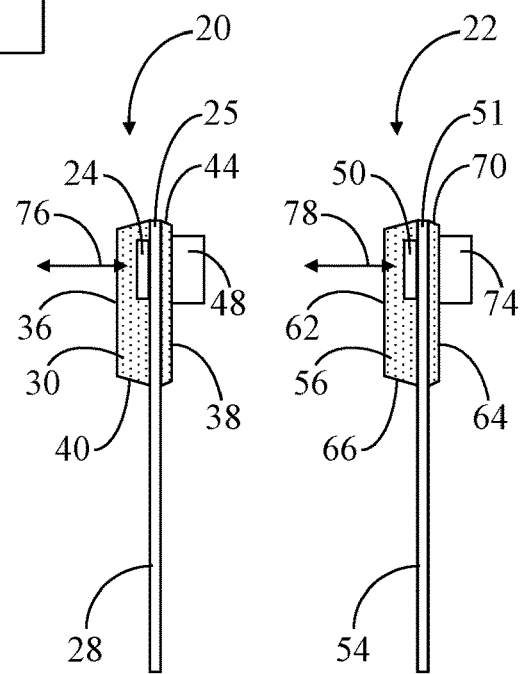
FIG. 2 shows a side view of the sensor packages of FIG. 1.
Figure 3:
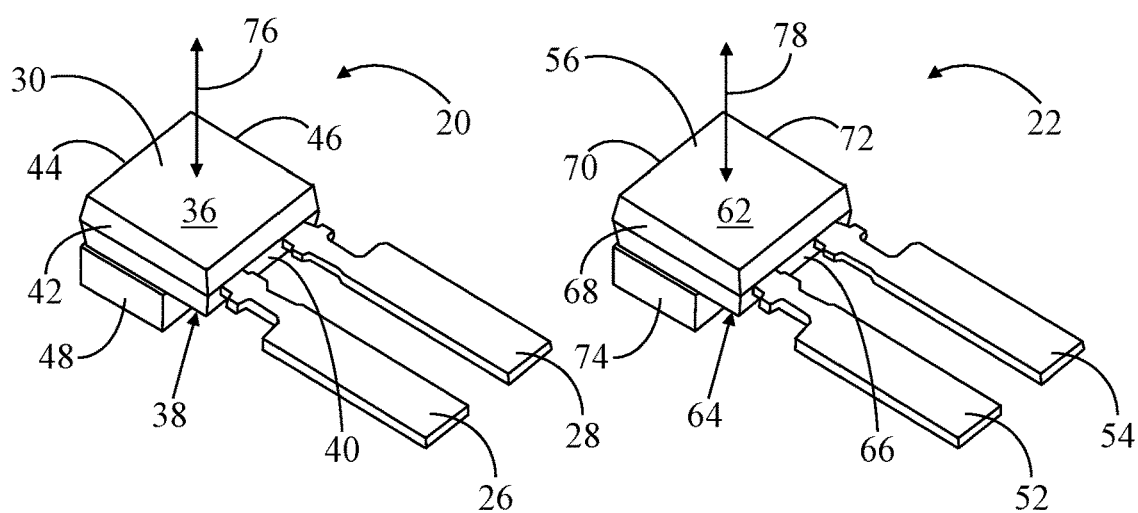
FIG. 3 shows a perspective view of the redundant sensor packages of FIG. 1.

Referring to FIG. 1-3, FIG. 1 shows a plan view of redundant sensor packages, FIG. 2 shows a side view of the redundant sensor packages, and FIG. 3 shows a perspective view of the redundant sensor packages. The redundant sensor packages include a first sensor package 20 and a second sensor package 22. The term "redundant" utilized herein refers to duplicated components, and in this example, sensor packages, to provide redundancy in case one of the sensor packages should fail. Such dual redundancy can provide robustness to the failure of one component, and error detection during a situation in which the two sensor packages give different results, when they would nominally give the same result.

First sensor package 20 includes a first sensor die 24 coupled to a die pad 25, a first set of connector pins that includes a first connector pin 26 and a second connector pin 28, and a first housing 30 in which first sensor die 24 is located. First and second connector pins 26, 28 are electrically connected to bond pads (not visible) on first sensor die 24 via bond wires 32. In some configurations, a capacitor (not shown) may interconnect distal ends 34 of first and second connector pins 26, 28. First housing 30 includes first and second surfaces 36, 38 spaced apart from one another by first, second, third, and fourth sidewalls 40, 42, 44, 46. First sensor package 20 further includes a first auxiliary component 48 positioned in proximity to second surface 38 of first housing 30. In some embodiments, first auxiliary component 48 is located outside of first housing 30 and is coupled to second surface 38 of first housing 30.

Likewise, second sensor package 22 includes a second sensor die 50 coupled to a die pad 51, a second set of connector pins that includes a third connector pin 52 and a fourth connector pin 54, and a second housing 56 in which second sensor die 50 is located. Third and fourth connector pins 52, 54 are electrically connected to bond pads (not visible) on second sensor die 50 via bond wires 58. Again, in some configurations, a capacitor (not shown) may interconnect distal ends 60 of third and fourth connector pins 52, 54. Second housing 56 includes third and fourth surfaces 62, 64 spaced apart from one another by fifth, sixth, seventh, and eighth sidewalls 66, 68, 70, 72. Second sensor package 22 further includes a second auxiliary component 74 positioned in proximity to fourth surface 64 of second housing 56. In some embodiments, second auxiliary component 74 is located outside of second housing 56 and is coupled to fourth surface 64 of second housing 56.

First and second housings 30, 56 may be formed from an epoxy resin thermoset material or any other suitable encapsulating material. Alternatively, first and second housings 30, 56 may be any other suitable cases or enclosures in which the respective sensor dies 24, 50, die pads 25, 51, distal ends 34, 60 of the connector pins 26, 28, 53, 54, and so forth may be located. First and second housings 30, 56 are represented in FIGS. 1 and 2 by a stippled pattern in order to distinguish them from the various other components. Additionally, the various components located within first and second housings 30, 56 are visible in FIGS. 1 and 2 for clarity. However, it should be understood that the components within first and second housings 30, 56 may not actually be visible in the manufactured first and second sensor packages 20, 22 as shown in FIG. 3.

In some embodiments, first and second sensor dies 24, 50 may be magnetic field sensors and first and second auxiliary components 48, 74 may include magnets. Each of first and second sensor dies 24, 50 may further include the magnetic field sensor integrated with application specific circuitry as a single block or unit. The magnetic field sensors (e.g., first and second sensor dies 24, 50) may be sensitive to motion of, for example, ferrous gear wheels and may therefore be implemented in a speed sensor application. Due to the effect of flux bending, the different directions of magnetic field lines from first and second magnets 48, 74 cause a variable electrical signal at each of first and second sensor dies 24, 50. Because of a chosen orientation of first sensor die 24 and a direction of ferrite magnetization of first magnet 48, first sensor die 24 may be sensitive to motion of, for example, a ferrous gear wheel along a first sensing axis 76 primarily in front of first sensor die, e.g., at first surface 36 of first sensor package. Likewise, due to a chosen orientation of second sensor die 50 and a direction of ferrite magnetization of second magnet 74, second sensor die 50 may also be sensitive to motion of, for example, a ferrous gear wheel along a second sensing axis 78 primarily in front second sensor die 50, e.g., at third surface 62 of second sensor package 22.

Application specific circuitry may suitably condition the signals from the magnetic field sensor of first sensor die 24 to output electrical signals indicative of the sensed magnetic field using first and second connector pins 26, 28 and application specific circuitry may suitably condition the signals from the magnetic field sensor of second sensor die 50 to output an electrical signal indicative of the sensed magnetic field using third and fourth connector pins 52, 54. The integrated capacitors (not shown) between first and second connector pins 26, 28 and third and fourth connector pins 52, 54 may provide immunity to and emission of electromagnetic disturbances.

First and second sensor packages 20, 22 may be implemented within an antilock braking system (ABS) or another vehicular speed sensing system. Such speed sensor integrated circuits may be overmolded with an overmold material (e.g., a thermoplastic or thermosetting polymer) to thereby form a sensor assembly to protect the various components from a harsh operational environment in which it will be used and to provide a mounting feature for attaching the sensor assembly in a predetermined location. In prior art sensor assemblies, a sensor package may be coupled to a plastic support or carrier of some sort to retain the sensor package in position, then the sensor package is overmolded with an overmold material to provide the final sensor assembly. As will be discussed in significantly greater detail below, embodiments entail a sensor assembly that includes first and second sensor packages 20, 22 in a redundant sensor configuration in which first and second sensor packages 20, 22 are adjacent to one another and their corresponding first and second sensing axes 76, 78 are laterally displaced from one another and extend parallel to one another. Further, embodiments described below remove the need for a support or carrier to allow for a reduction in complexity and costs of the resulting sensor assembly, enabling enhanced reliability of the sensor assembly through a reduction in the potential for delamination, and so forth. Although a redundant magnetic field sensor configuration for use in a speed sensor application is described herein, other redundant sensor assembly designs may be envisioned in which the sensor packages may be overmolded to form a sensor assembly without first coupling the sensor packages to a plastic support or carrier.

Figure 4:
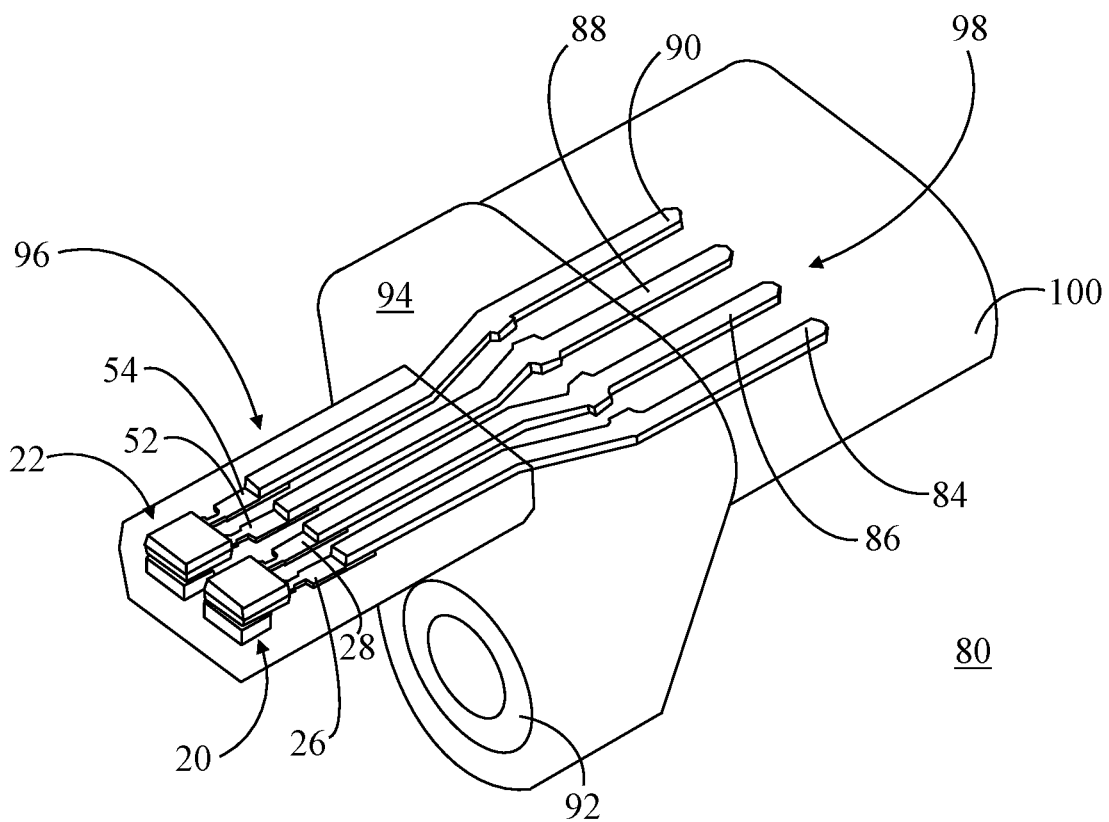
FIG. 4 shows a perspective view of a sensor assembly in accordance with an embodiment.
Figure 5:
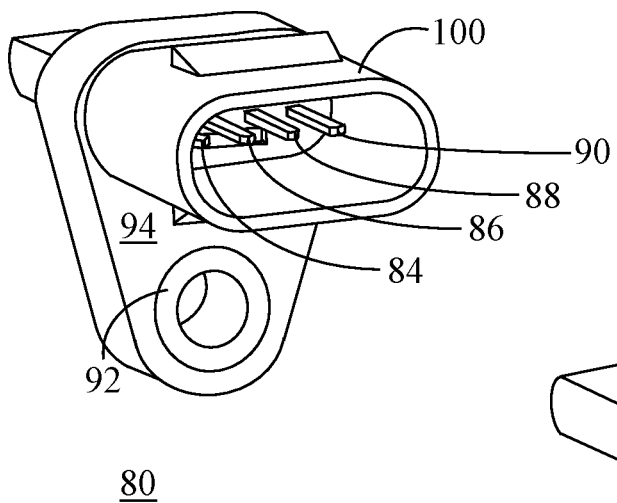
FIG. 5 shows a rear perspective view of the sensor assembly of FIG. 4.
Figure 6:
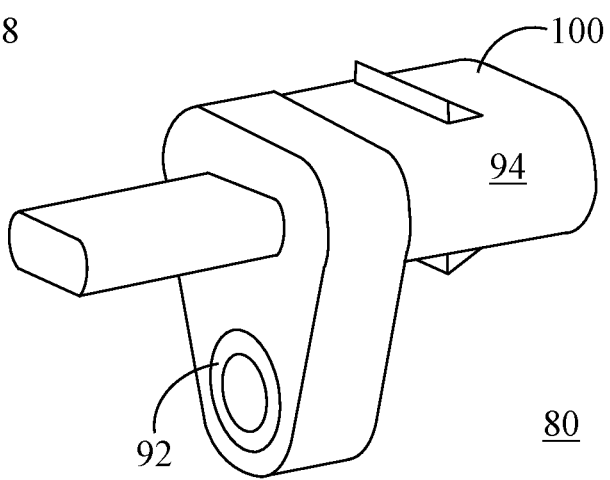
FIG. 6 shows another perspective view of the sensor assembly of FIG. 4.

Referring now to FIGS. 4-6, FIG. 4 shows a perspective view of a sensor assembly 80 in accordance with an embodiment, FIG. 5 shows a rear perspective view of sensor assembly 80, and FIG. 6 shows another perspective view of sensor assembly 80. The various components within sensor assembly 80 are visible in FIG. 4 for clarity. However, it should be understood that the components within sensor assembly 80 may not actually be visible in the manufactured assembly.

Sensor assembly 80 includes first and second sensor packages 20, 22 as described in detail above. Sensor assembly 80 further includes an electrically conductive structure, which in some embodiments may be a frame structure 82. Frame structure 82 has first, second, third, and fourth conductors 84, 86, 88, 90 (individually distinguishable in FIG. 4) coupled to respective first, second, third, and fourth connector pins 26, 28, 52, 54 of first and second sensor packages 20, 22. In some embodiments, first, second, third, and fourth conductors 84 86, 88, 90 of frame structure 82 may be aligned substantially parallel to one another. In some configurations, sensor assembly 80 may further include a retainer ring 92 (which may be a metal bushing or other mounting feature) for mounting sensor assembly 80 in an end-use application.

An overmold material 94 (e.g., a thermoplastic or thermosetting polymer) is overmolded about first and second sensor packages 20, 22, an end 96 of frame structure 82 at the interconnection of first, second, third, and fourth conductors 84, 86, 88, 90 with respective first, second, third, and fourth connector pins 26, 28, 52, 54, and retainer ring 92. Overmold material 94 may be any suitable material that can flow well during an overmolding process and can achieve suitably thin walls often required in certain applications, such as, for example, speed sensor applications. First and second sensor packages 20, 22 and frame structure 82 are directly overmolded with overmold material 94 without first being attached to any type of carrier structure, as discussed above.

In the illustrated embodiment, an opposing end 98 of the straight first, second, third, and fourth conductors 84, 86, 88, 90 of frame structure 82 extend out of overmold material 94 and reside in a connector basket 100. In use, first, second, third, and fourth conductors 84, 86, 88, 90 may be connected to a receiving part (e.g., secondary structure, cable, and so forth in accordance with a particular design, not shown) to provide electrical connection to first and second sensor packages 20, 22.

Figure 7:
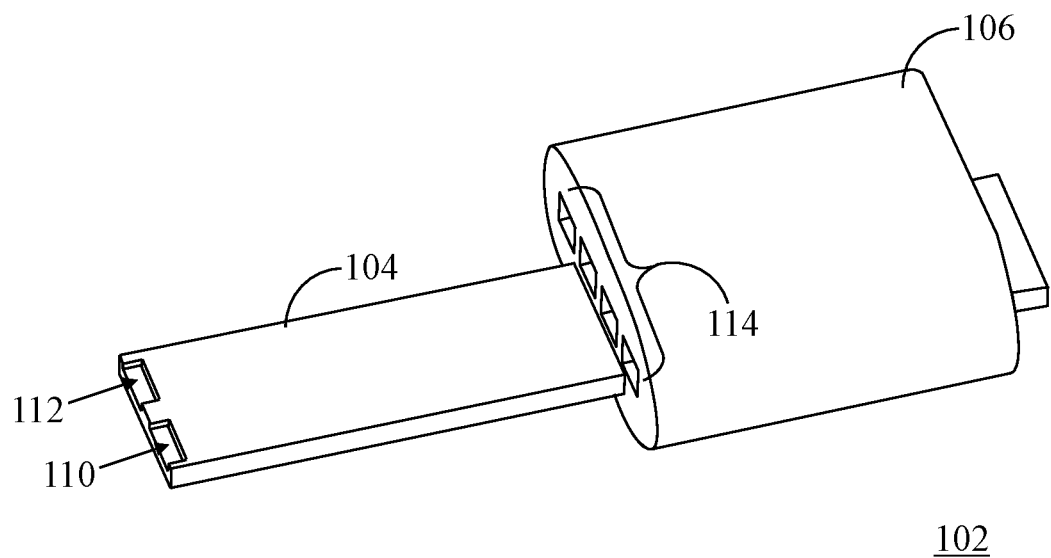
FIG. 7 shows a perspective view of an alignment tool for retaining the redundant sensor packages in a mold tool during overmolding to produce the sensor assembly.
Figure 8:
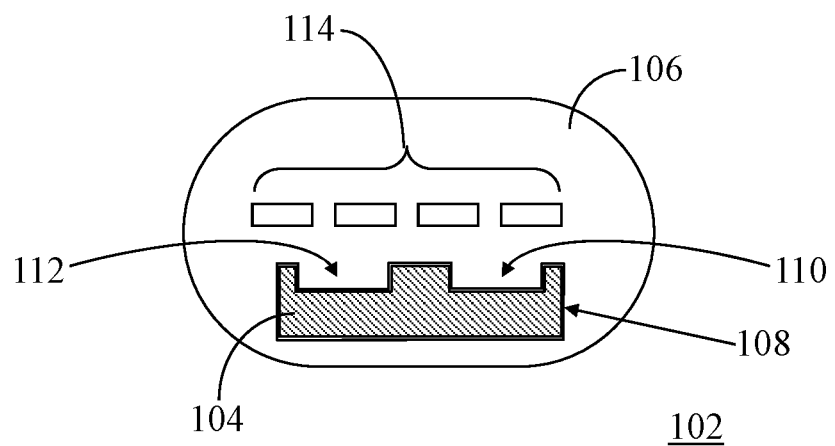
FIG. 8 shows a rear plan view of the alignment tool of FIG. 7.

Referring to FIGS. 7-8, FIG. 7 shows a perspective view of an alignment tool 102 for retaining the redundant sensor packages (e.g., first and second sensor packages 20, 22) in a mold tool during overmolding to produce sensor assembly 80 (FIGS. 4-6) and FIG. 8 shows a rear plan view of alignment tool 102. In general, alignment tool 102 includes an alignment bar 104 extending from a pin support 106. More particularly, pin support 106 includes an opening 108 extending through it and sized to accommodate passage of alignment tool 102 during an overmolding process. Thus, alignment bar 104 is slidable within opening 108. In FIG. 7, alignment bar 104 is shaded with hatching to distinguish it from the surrounding pin support 106.

Alignment bar 104 includes a first notch region 110 and a second notch region 112. In some embodiments, the first and second auxiliary components of the first and second sensor packages (e.g., first and second magnets 48, 74 of first and second sensor packages 20, 22 shown in FIG. 3) are sized to reside in respective first and second notch regions 110, 112 in alignment bar 104 of alignment tool 102 during the overmolding process. Pin support 106 is generally sized to yield connector basket 100 (FIGS. 4-6) during the overmolding process. Pin support 106 includes multiple receiving features 114 (e.g., sockets or passages) into which first, second, third, and fourth conductors 84, 86, 88, 90 (FIG. 4) of frame structure 82 (FIG. 4) can be inserted during the overmolding process. Alignment tool 102 will be further discussed in connection with fabrication methodology for sensor assembly 80 (FIGS. 4-6).

Figure 9:
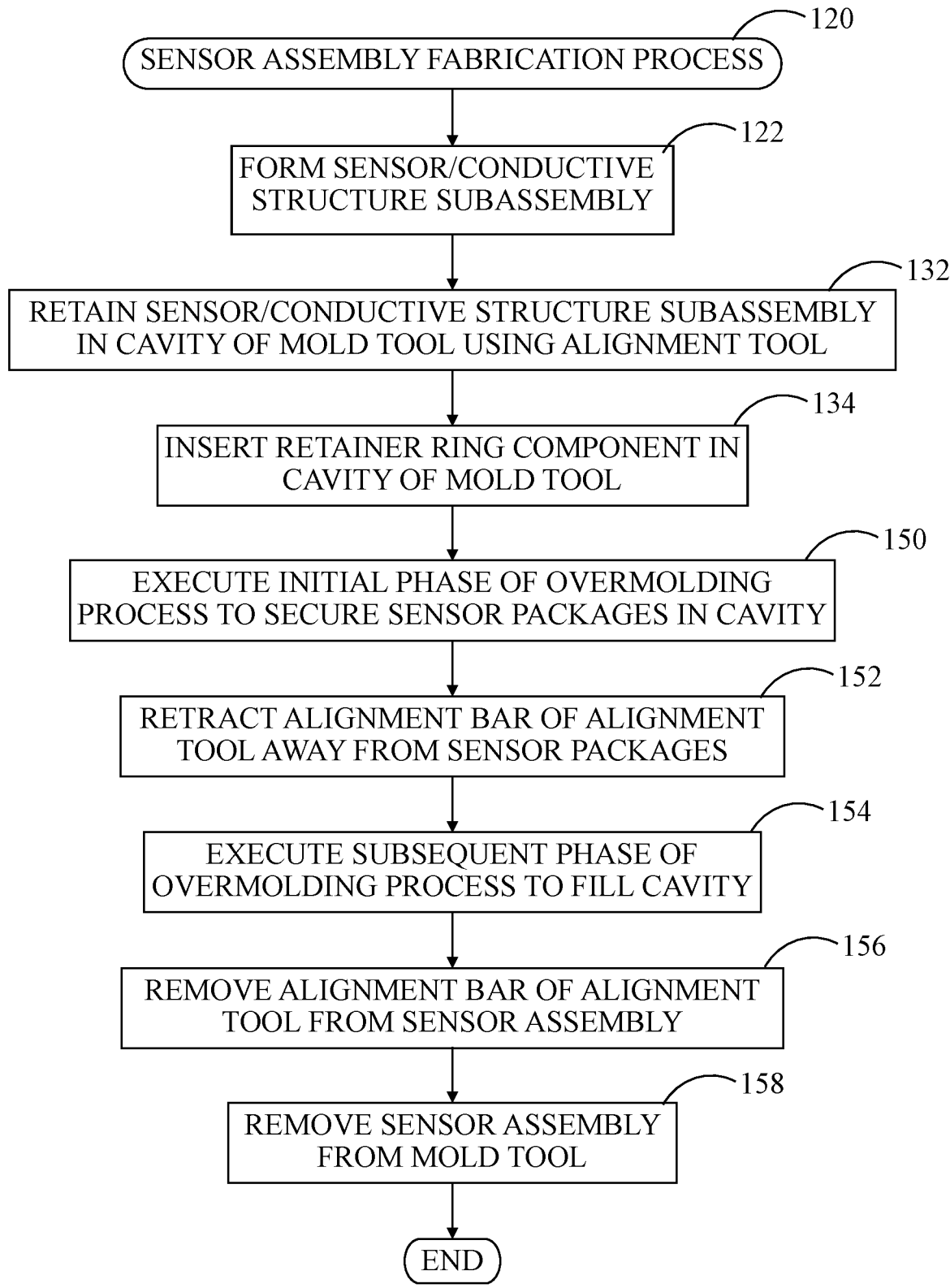
FIG. 9 shows a flowchart of a sensor assembly fabrication process in accordance with another embodiment.

FIG. 9 shows a flowchart of a sensor assembly fabrication process 120 in accordance with another embodiment. Sensor assembly fabrication process 120 provides an overview of the operations implemented to form a sensor assembly that includes two sensor packages in a redundant configuration. Sensor assembly fabrication process 120 will be described in connection with the fabrication of sensor assembly 80 (FIGS. 4-6). However, process 120 can be readily implemented to fabricate other embodiments of dual sensor assemblies some of which will be described in connection with FIGS. 18-27.

Figure 10:
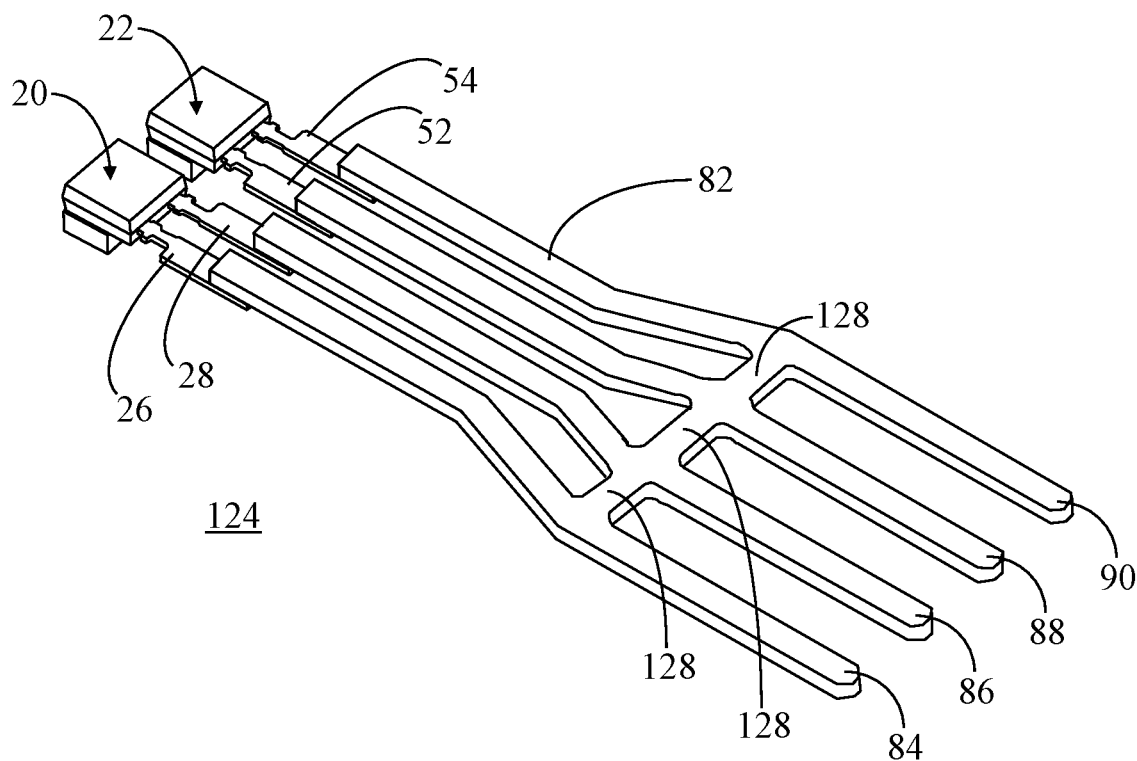
FIG. 10 shows a perspective view of the redundant sensor packages at an initial stage of the sensor assembly fabrication process of FIG. 9.

At a block 122 a sensor/conductive structure subassembly is formed. Referring to FIG. 10 in conjunction with block 122, FIG. 10 shows a perspective view of the redundant sensor packages (e.g., first and second sensor packages 20, 22) at an initial stage 124 of the sensor assembly fabrication process 120. At initial stage 124, first and second sensor packages 20, 22 may be welded or otherwise suitably coupled with frame structure 82 such that first and second connector pins 26, 28 of first sensor package 20 are coupled with first and second conductors 84, 86 of frame structure 82 and such that third and fourth connector pins 52, 54 of second sensor package 22 are coupled with third and fourth conductors 88, 90 of frame structure 82.

Figure 11:
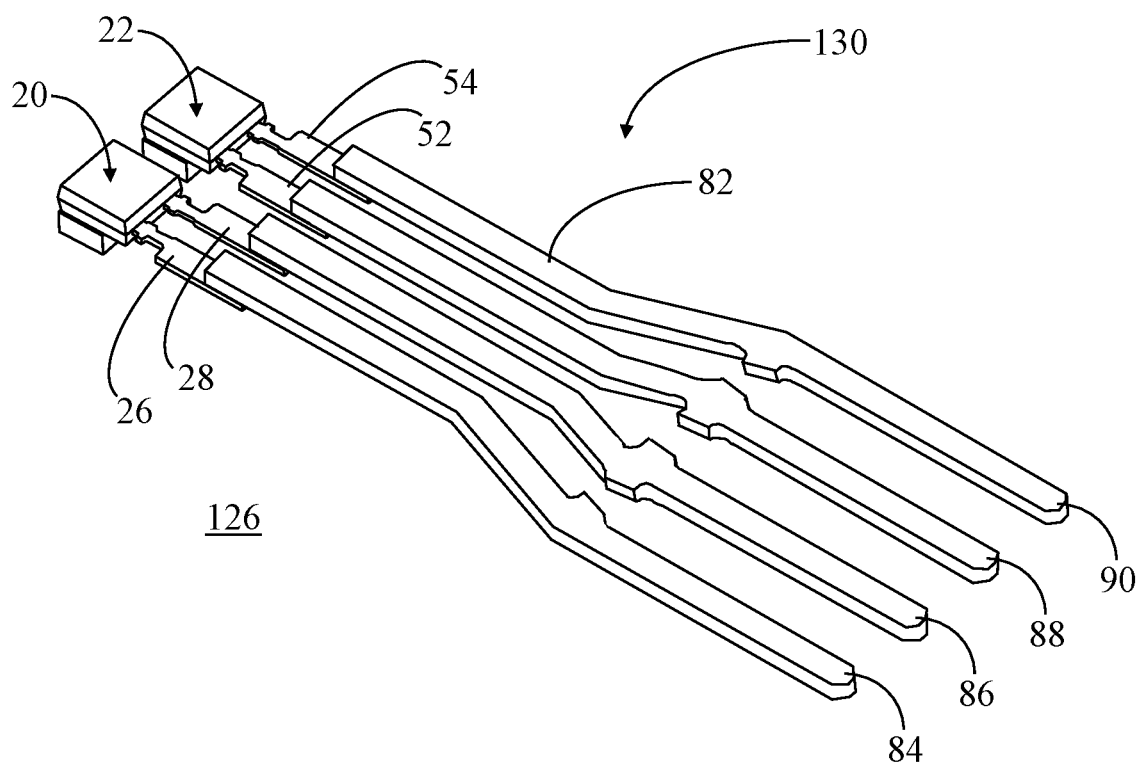
FIG. 11 shows a perspective view of the redundant sensor packages of FIG. 10 at a subsequent stage of the sensor assembly fabrication process.

FIG. 11 shows a perspective view of the redundant sensor packages of FIG. 10 at a subsequent stage 126 of fabrication process 120 following initial stage 124 illustrated in FIG. 10 in accordance with block 122. At subsequent stage 126, bridges 128 (shown in FIG. 10) between adjacent first, second, third, and fourth conductors 84, 86, 88, 90 are stamped off or otherwise removed from frame structure 82 to electrically isolate conductors 84, 86, 88, 90 from one another. As such, a dual sensor/frame structure subassembly 130 is produced.

With reference back to sensor assembly fabrication process 120 (FIG. 9), following subassembly forming block 122, process 120 continues at a block 132. At block 132, dual sensor/frame structure subassembly 130 is retained in a cavity of a mold tool using an alignment tool and at a block 134 a retainer ring component (e.g., retainer ring 92 of FIGS. 4-6) is also retain in the cavity of the mold tool. In the example set forth in connection with FIGS. 1-3, first and second sensor packages 20, 22 of subassembly 130 are retained in the cavity of a mold tool using alignment tool 102.

Figure 12:
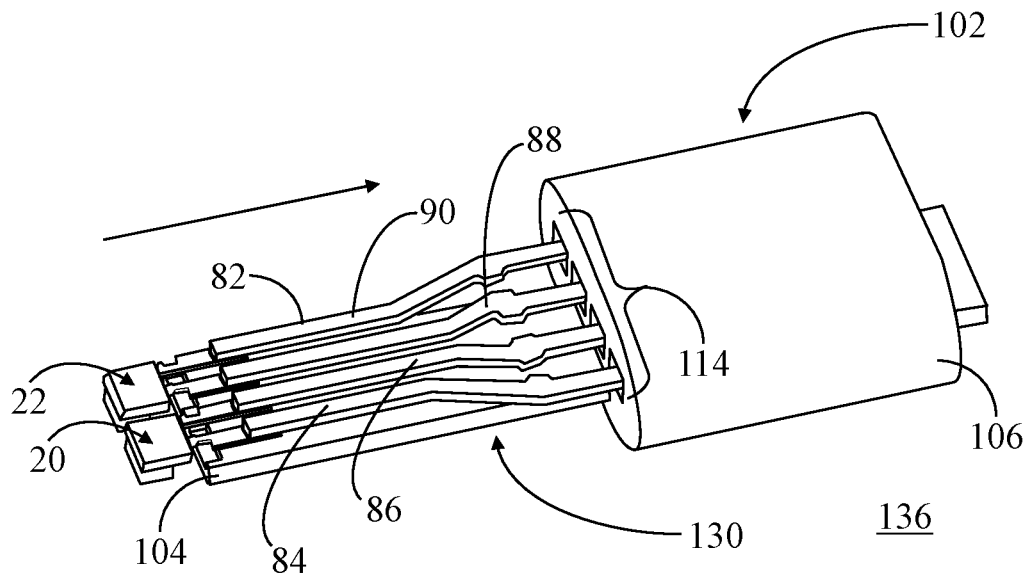
FIG. 12 shows a perspective view of the redundant sensor packages of FIG. 11 at a subsequent stage of the sensor assembly fabrication process.

Referring to FIG. 12 in conjunction with block 132, FIG. 12 shows a perspective view of the redundant sensor packages of FIG. 11 at a subsequent stage 136 of sensor assembly fabrication process 120 following stage 126 illustrated in FIG. 11. As shown, dual sensor/frame structure subassembly 130 is being placed in alignment tool 102. In some embodiments, first, second, third, and fourth conductors 84, 86, 88, 90 are inserted (denoted by an arrow in FIG. 12) into receiving features 114 of pin support 106.

Figure 13:
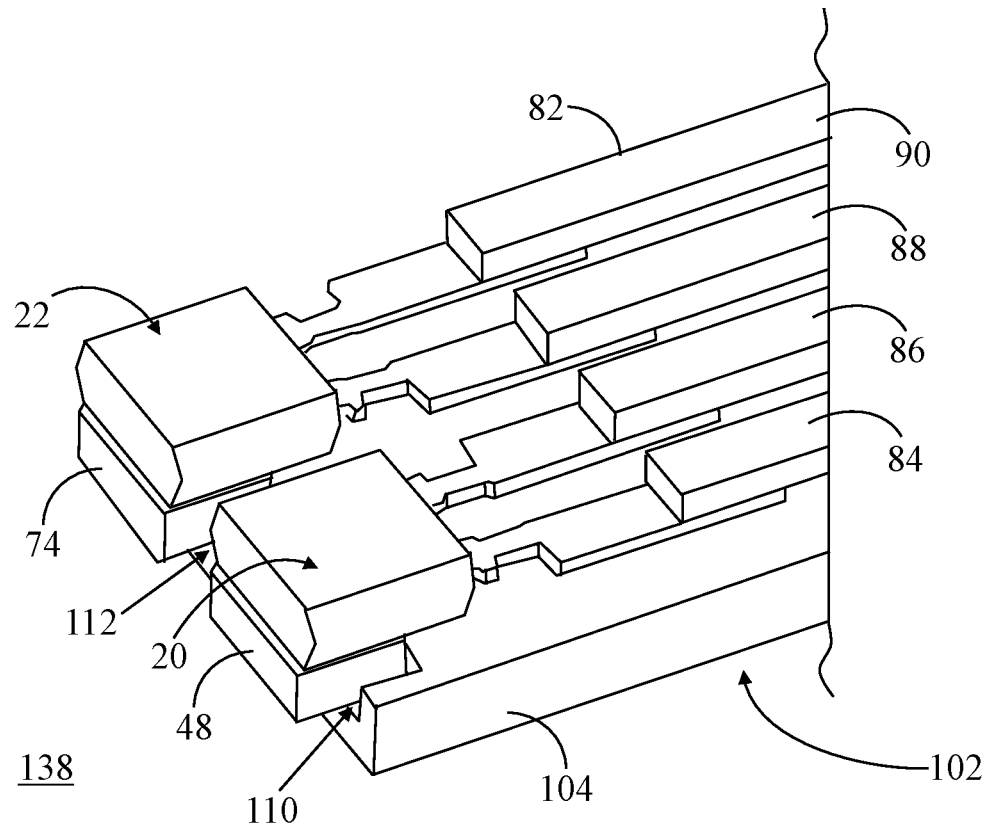
FIG. 13 shows an enlarged perspective view of the redundant sensor packages of FIG. 12 at a subsequent stage of the sensor assembly fabrication process.

FIG. 13 shows an enlarged perspective view of the redundant sensor packages at a subsequent stage 138 of sensor assembly fabrication process 120 following stage 136 illustrated in FIG. 12. As shown, first sensor package 20 is received in first notch region 110 extending into alignment bar 104 of alignment tool 102. Concurrently, second sensor package 22 is received in second notch region 112 extending into alignment bar 104 of alignment tool 102. Thus, first auxiliary component 48 (e.g., a first magnet) of first sensor package 20 is seated in first notch region 110 and second auxiliary component 74 (e.g., a second magnet) of second sensor package 22 is seated in second notch region 112. Accordingly, first and second sensor packages 20, 22 are positioned adjacent to one another such that their respective sensing axes 76, 78 (FIG. 3) are laterally displaced from one another and extend parallel to one another.

Figure 14:
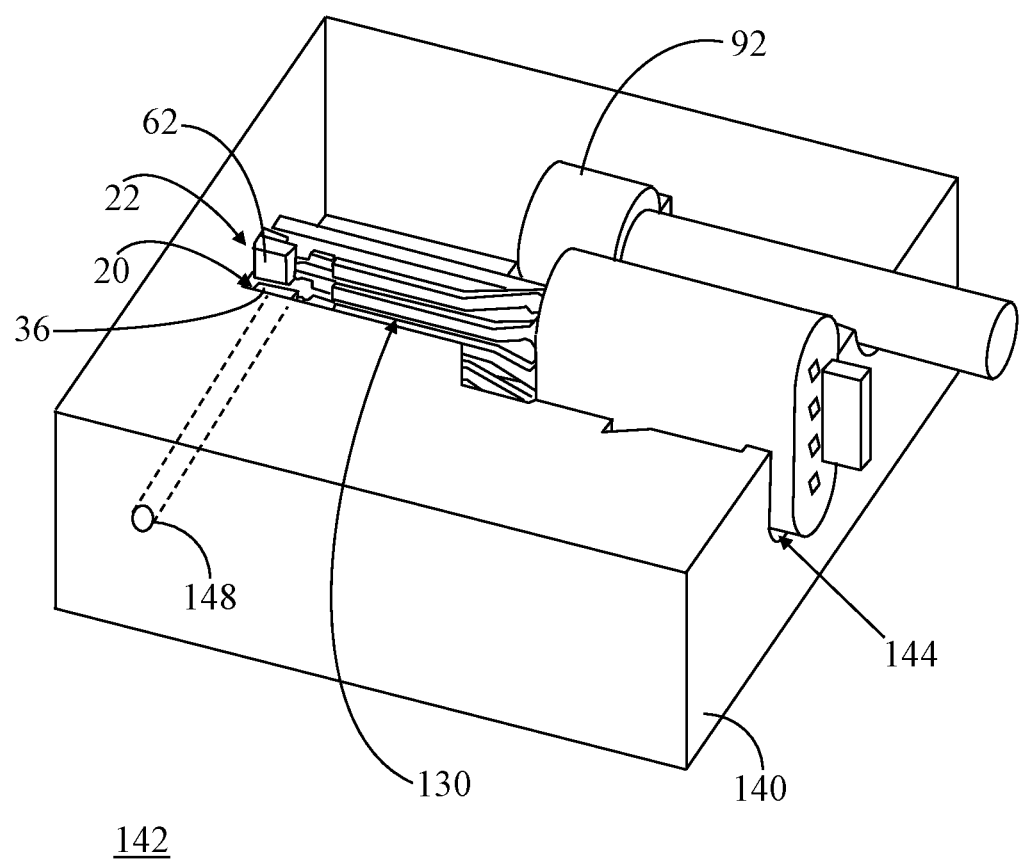
FIG. 14 shows a perspective view of a sensor/conductive structure subassembly in a mold tool.

FIG. 14 shows a perspective view of dual sensor/frame structure subassembly 130 in a mold tool 140 at a subsequent stage 142 of process 120 following stage 138. As shown, dual sensor/frame structure subassembly 130 (secured to alignment bar 104 of alignment tool 102) is retained in a cavity 144 of mold tool 140 (only a bottom portion of mold tool 140 is shown). Additionally, retainer ring 92 is inserted in mold tool 140. A plug element 146 may hold retainer ring 92 in mold tool 140 and prevent leakage of overmold material 94 (FIGS. 4-6) during a subsequent overmolding process. A gate 148 (entrance into cavity 144) for passage of overmold material 94 may be provided near first and second sensor packages 20, 22. Gate 148 may be oriented roughly transverse to first and third surfaces 36, 62 of sensor packages 20, 22 so that the flow of overmold material 94 will not push first and second sensor packages 20, 22 out of first and second notch regions 110, 112 (FIGS. 7-8) of alignment bar 104. However, other suitable locations for gate 148 may alternatively be implemented.

With reference back to sensor assembly fabrication process 120 (FIG. 9), following placement of sensor/frame structure subassembly 130 and retainer ring 92 in mold tool 140 at blocks 132, 134, fabrication process 120 continues at a block 150. At block 150, methodology entails executing an initial phase of an overmolding process to secure the sensor packages in the cavity of the mold tool. At a block 152, the alignment bar of the alignment tool is retracted away from the redundant sensor packages. At a block 154, methodology entails executing a subsequent phase of the overmolding process to fill the cavity of the mold tool and thereby form the sensor assembly. This subsequent phase of the overmolding process may, in some embodiments, partially overmold the alignment bar. Thus, at a block 156, the alignment bar of the alignment tool may be removed from the overmolded sensor assembly within the mold tool and at a block 158, the sensor assembly is removed from the mold tool.

Figure 15:
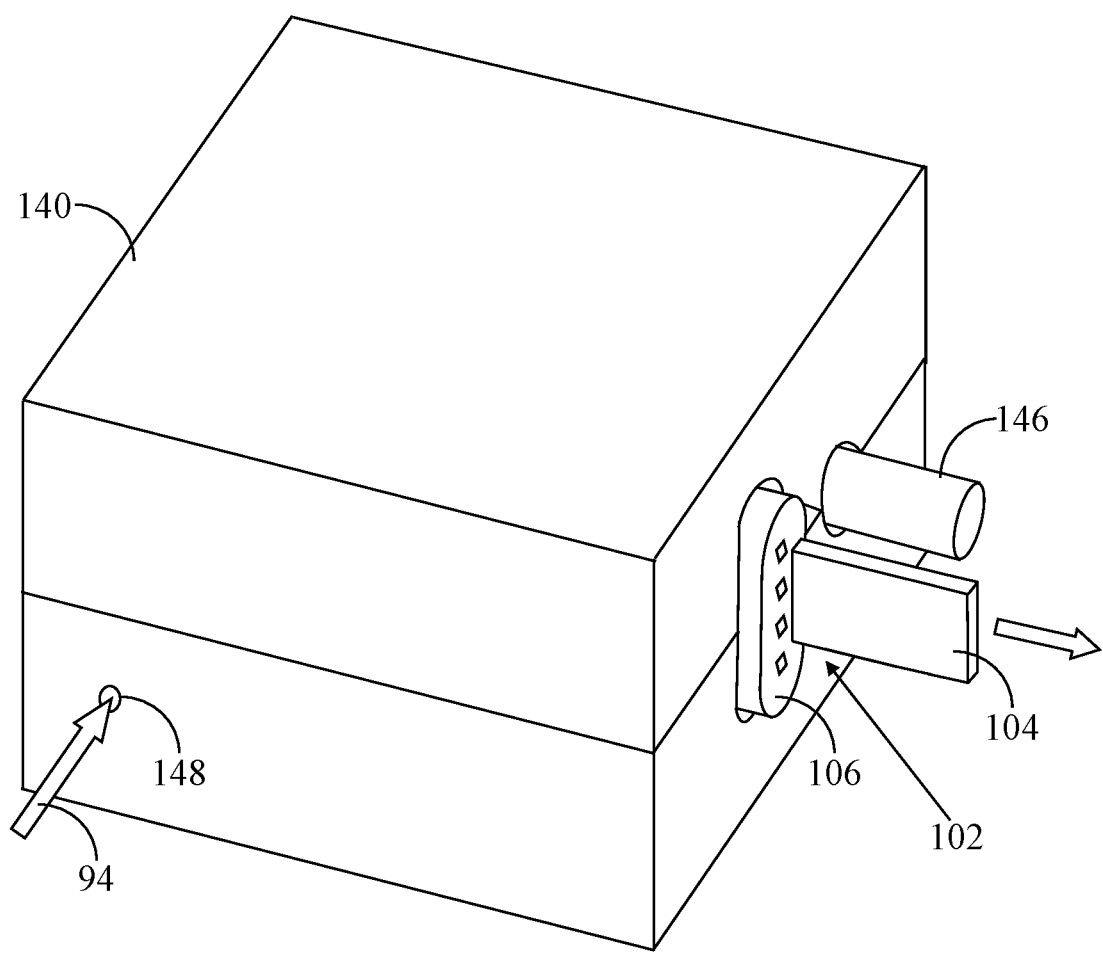
FIG. 15 shows a simplified perspective view of the mold tool during an overmolding process.

Referring to FIG. 14 and additionally to FIG. 15 in connection with blocks 150, 152, 154, 156 of sensor assembly fabrication process 120, FIG. 15 shows a perspective view of mold tool 140 during an overmolding process with the dual sensor/frame structure subassembly 130 (not visible) and alignment tool 102 enclosed within mold tool 140. In FIG. 15, two halves of mold tool 140 enclose dual sensor/frame structure subassembly 130. Plug element 146 and alignment tool 102 extend outwardly from mold tool 140. In the example of FIG. 15, at gate 148, overmold material 94 (represented by an arrow) initially fills cavity 144 at the location of first and second sensor packages 20, 22. Alignment bar 104 having first and second notch regions 110, 112 (see especially FIG. 13) holds first and second sensor packages 20, 22 in place so that the flow of overmold material 94 will not push first and second sensor packages 20, 22 out of place.

After the initial phase of the overmolding process to partially fill cavity 144 and therefore secure first and second sensor packages 20, 22 in cavity 144, alignment bar 104 of alignment tool 102 is retracted away from first and second sensor packages 20, 22. This is demonstrated in FIG. 15 by the arrow near alignment bar 104 and with alignment bar 104 extending farther outside of mold tool 140 than in FIG. 14. Following retraction of alignment bar 104, the subsequent phase of the overmolding process is executed to fill cavity 144. That is, the overmolding process continues following retraction of alignment bar 104 in order to completely fill cavity 144.

Figure 16:
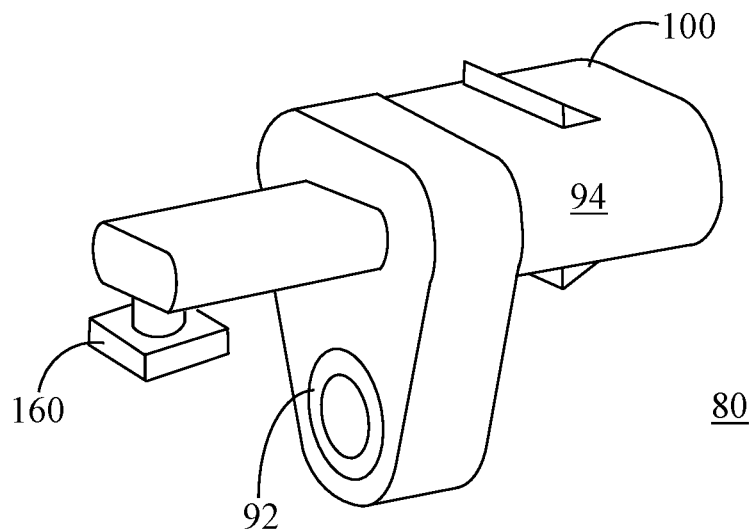
FIG. 16 shows a perspective view of the sensor assembly following the overmolding process and including a handling pin.
Figure 17:
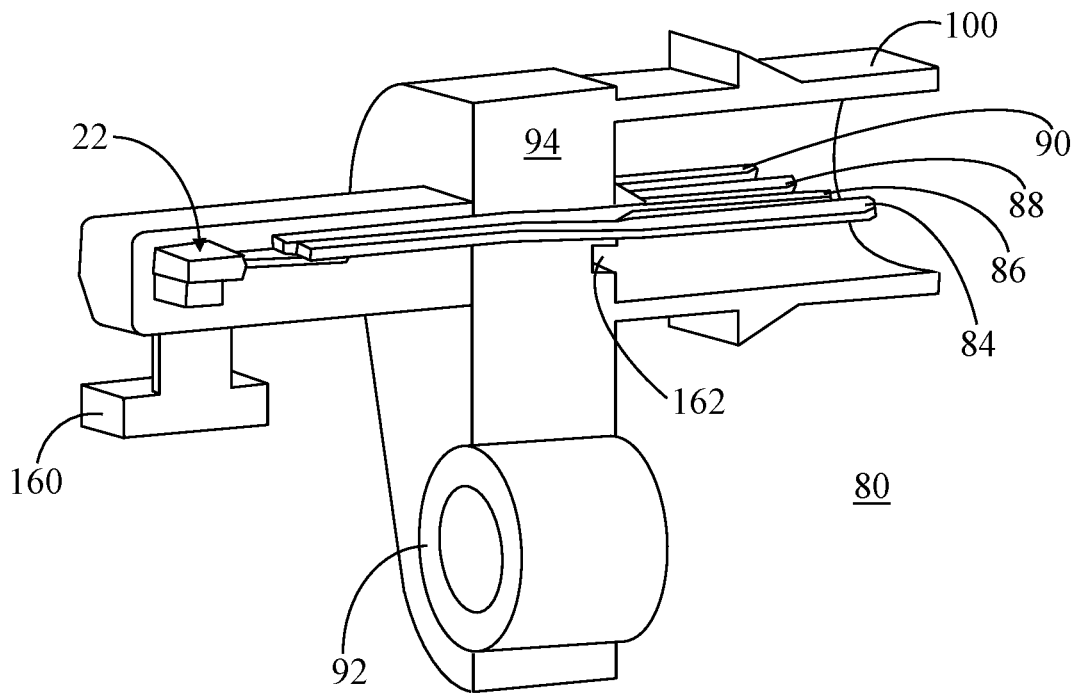
FIG. 17 shows a sectional side perspective view of the sensor assembly of FIG. 16.

Referring to FIGS. 16-17, FIG. 16 shows a perspective view of sensor assembly 80 following the overmolding process and including a handling pin 160 and FIG. 17 shows a sectional side perspective view of sensor assembly 80. Thus, FIGS. 16-17 represent sensor assembly 80 immediately following its removal from mold tool 140 in accordance with block 158 of sensor assembly fabrication process 120 (FIG. 9). In some configurations, sensor assembly 80 may include handling pin 160 for the purposes of moving and positioning sensor assembly 80 during production. Handling pin 160 may eventually be removed prior to placing sensor assembly 80 in operational use.

In the side sectional view of FIG. 17, only second sensor package 22 is visible. However, as discussed previously, first sensor package 20 is located in sensor assembly 80 adjacent to second sensor package 22. First and second sensor packages 20, 22 and the attached frame structure 82 are directly overmolded with overmold material 94 without being attached to a carrier structure. First, second, third, and fourth conductors 84, 86, 88, 90 of frame structure 82 reside in connector basket 100.

Also as illustrated in FIG. 17, sensor assembly 80 includes indentions or imprints, referred to herein as markings 162. As described previously, alignment bar 104 (FIG. 15) is configured to hold first and second sensor packages 20, 22 in the mold tool during the overmolding process. Further, alignment bar 104 is configured to be retracted away from first and second sensor packages 20, 22 following an initial phase of the overmolding process but may remain in the mold tool such that alignment bar 104 is partially overmolded with overmold material 94. Following the overmolding process, alignment bar 104 may be removed from overmold material 94 such that markings 162 of alignment bar 104 remain in overmold material 94. Hence, markings 162 are residual features that may remain in an outer surface of overmold material 94 following fabrication of sensor assembly 80.

In some embodiments, alignment bar 104 may not be retracted following the initial phase of the overmolding process. Rather, alignment bar 104 may be removed following completion of the overmolding process. As such, one or more openings extending in proximity to first and second sensor packages 20, 22 may be suitably sealed with, for example, a potting compound to prevent or largely limit ingress of contaminants into sensor assembly 80.

Thus, execution of sensor assembly fabrication process 120 (FIG. 9) enables the implementation of a direct overmolding technique for a redundant sensor configuration that does not require overmolding a support or carrier into the dual sensor assembly. This is accomplished by equipping an alignment bar of an alignment tool with special features (e.g., notch regions) which are used for alignment and secure retention of two sensor packages during the overmolding process. It should be understood that certain ones of the process blocks depicted in FIG. 9 may be performed in parallel with each other or with performing other processes. In addition, the particular ordering of the process blocks depicted in FIG. 9 may be modified, while achieving substantially the same result. Accordingly, such modifications are intended to be included within the scope of the inventive subject matter.

Referring to FIGS. 18-20, FIG. 18 shows a plan view of redundant sensor packages in accordance with another embodiment, FIG. 19 shows a side view the sensor packages of FIG. 18, and FIG. 20 shows a perspective view of the redundant sensor packages of FIG. 18. The redundant sensor packages include a first sensor package 164 and a second sensor package 166.

First sensor package 164 includes a first sensor die 168 coupled to a first side 170 of a die pad 172. One or more auxiliary components 174 may be coupled to a second side 176 of die pad 172. First and second connector pins 178, 180 are electrically connected to bond pads (not visible) on first sensor die 168 via bond wires 182. In some embodiments, a first capacitor 184 may interconnect distal ends 186 of first and second connector pins 178, 180. First sensor die 168, die pad 172, distal ends 184 of first and second connector pins 178, 180, bond wires 182, and first capacitor 184 are located in a first housing 188. In the illustrated embodiment, first auxiliary component 174 is also located in first housing 188.

First housing 188 includes first and second surfaces 190, 192 spaced apart from one another by first, second, third, and fourth sidewalls 194, 196, 198, 200. First housing 188 further includes a first notch region 202 extending into first surface 190 of first housing 188 such that a material portion of first housing 188 is absent at first sidewall 194 and at first surface 190 of first housing 188. Although, first housing 188 is illustrated in FIGS. 18 and 19 with a stippled pattern, first notch region 202 is not stippled in order to better visualize it. However, the portion of first housing 188 surrounding first notch region 188 includes sidewalls and a bottom surface (best seen in FIG. 20) so that the components within first sensor package 164 are fully enclosed by first housing 188.

As shown, first sensor die 168 is located proximate first surface 190 of first housing 188 by virtue of its location on first side 170 of die pad 172. Similarly, first auxiliary component 174 is located proximate second surface 192 of first housing 188 by virtue of its location on second side 176 of die pad 172. Additionally, first sensor die 168 is laterally displaced away from first notch region 202 toward third sidewall 198, which is positioned opposite from first sidewall 194. This particular location of first sensor die 168 within first housing 188 enables the sensitive area (e.g. a reading point of a magnetic sensor) to be close to first surface 190 of first sensor package 164, and ultimately close to an external surface of a sensor assembly that includes first sensor package 164. Further, first notch region 202 may be positioned between first and second connector pins 178, 180.

Second sensor package 166 includes a second sensor die 204 coupled to a first side 206 of a die pad 208. One or more auxiliary components 210 may be coupled to a second side 212 of die pad 208. Third and fourth connector pins 214, 216 are electrically connected to bond pads (not visible) on second sensor die 204 via bond wires 218. In some embodiments, a second capacitor 220 may interconnect distal ends 222 of third and fourth connector pins 214, 216. Second sensor die 204, die pad 208, distal ends 222 of third and fourth connector pins 214, 216, bond wires 218, and second capacitor 220, are located in a second housing 224. In the illustrated embodiment, second auxiliary component 210 is also located in second housing 224.

Second housing 224 includes third and fourth surfaces 226, 228 spaced apart from one another by fifth, sixth, seventh, and eighth sidewalls 230, 232, 234, 236. Second housing 224 further includes a second notch region 238 extending into third surface 226 of second housing 224 such that a material portion of second housing 224 is absent at fifth sidewall 230 and at third surface 226 of second housing 224. Again, second housing 224 is illustrated in FIGS. 18 and 19 with a stippled pattern. However, second notch region 238 is not stippled in order to better visualize it, and the portion of second housing 224 surrounding second notch region 238 includes sidewalls and a bottom surface (best seen in FIG. 20) so that the components within second sensor package 166 are fully enclosed by second housing 224.

As shown, second sensor die 204 is located proximate third surface 226 of second housing 224 by virtue of its location on first side 206 of die pad 208. Similarly, second auxiliary component 210 is located proximate fourth surface 228 of second housing 224 by virtue of its location on second side 212 of die pad 208. Additionally, second sensor die 204 is laterally displaced away from second notch region 238 toward seventh sidewall 234, which is positioned opposite from fifth sidewall 230. Like first sensor package 164, this particular location of second sensor die 204 within second housing 224 enables the sensitive area (e.g. a reading point of a magnetic sensor) to be close to third surface 226 of second sensor package 166, and ultimately close to an external surface of a sensor assembly that includes second sensor package 166. Further, second notch region 238 may be positioned between third and fourth connector pins 214, 216.

In some embodiments, first and second sensor dies 168, 204 may be magnetic field sensors and first and second auxiliary components 174, 210 may include magnets. Because of a chosen orientation of first sensor die 168 and a direction of ferrite magnetization of first magnet 174, first sensor die 168 may be sensitive to motion of, for example, a ferrous gear wheel along a first sensing axis 240 primarily in front of first sensor die 168. Likewise, due to a chosen orientation of second sensor die 204 and a direction of ferrite magnetization of second magnet 210, second sensor die 204 may also be sensitive to motion of, for example, a ferrous gear wheel along a second sensing axis 242 primarily in front second sensor die 204.

Figure 21:
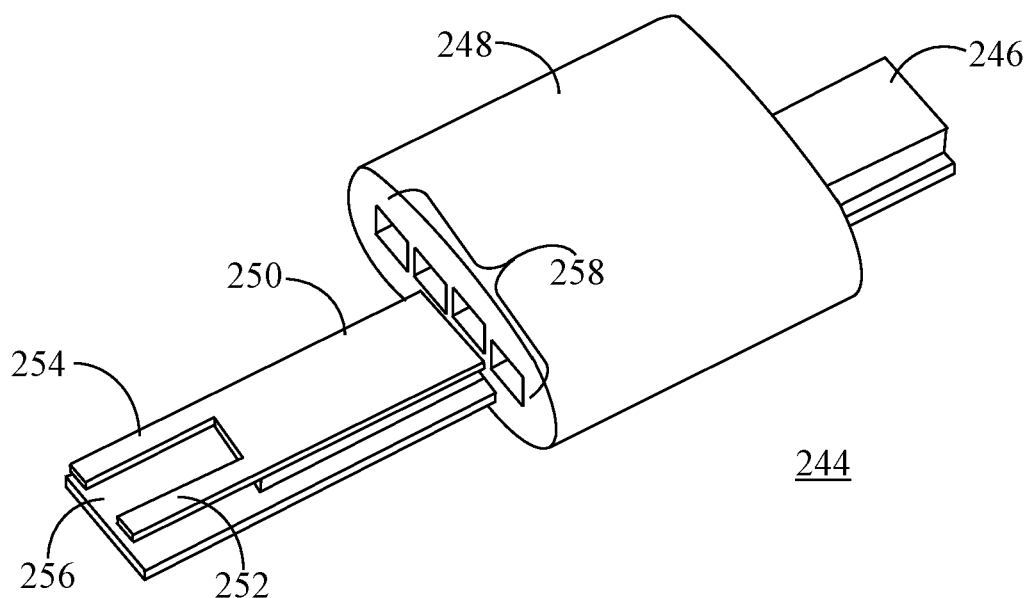
FIG. 21 shows a perspective view of another alignment tool for retaining the redundant sensor packages of FIGS. 18-20 in a mold tool during overmolding to produce a sensor assembly in accordance with another embodiment.

FIG. 21 shows a perspective view of another alignment tool 244 for retaining the redundant sensor packages of FIGS. 18-20 in a mold tool during overmolding to produce a dual sensor assembly in accordance with another embodiment. In general, alignment tool 244 includes an alignment assembly 246 configured to be seated in a similarly shaped opening in a pin support 248. Alignment assembly 246 includes a base structure 250 having first and second alignment bars 252, 254 and a platform region 256 extending from an end of base structure 250.

Referring back to FIGS. 18-20 in connection with FIG. 21, in some embodiments, first notch region 202 in first housing 188 of first sensor package 164 is sized to receive first alignment bar 252 of alignment tool 244. Likewise, second notch region 238 in second housing 224 of second sensor package 166 is sized to receive second alignment 254 of alignment tool 244. More particularly, first alignment bar 252 is configured to be received in first notch region 202 and second alignment bar 254 is configured to be received in second notch region 238. Additionally, platform region 256 is configured to be placed against second surface 192 of first housing 188 of first sensor package 164 and against fourth surface 228 of second housing 224 of second sensor package 166. Thus, alignment assembly 246 is configured to hold first and second sensor packages 164, 166 adjacent to one another during the overmolding process described in connection with FIG. 9, such that their sensing axes 240, 242 are laterally displaced from one another and extend parallel to one another in a resulting dual sensor assembly. Additionally, pin support 248 is generally sized to yield a connector basket (such as that shown in FIGS. 4-6) during the overmolding process and pin support 248 includes multiple receiving features 258 (e.g., sockets or passages).

Figure 22:
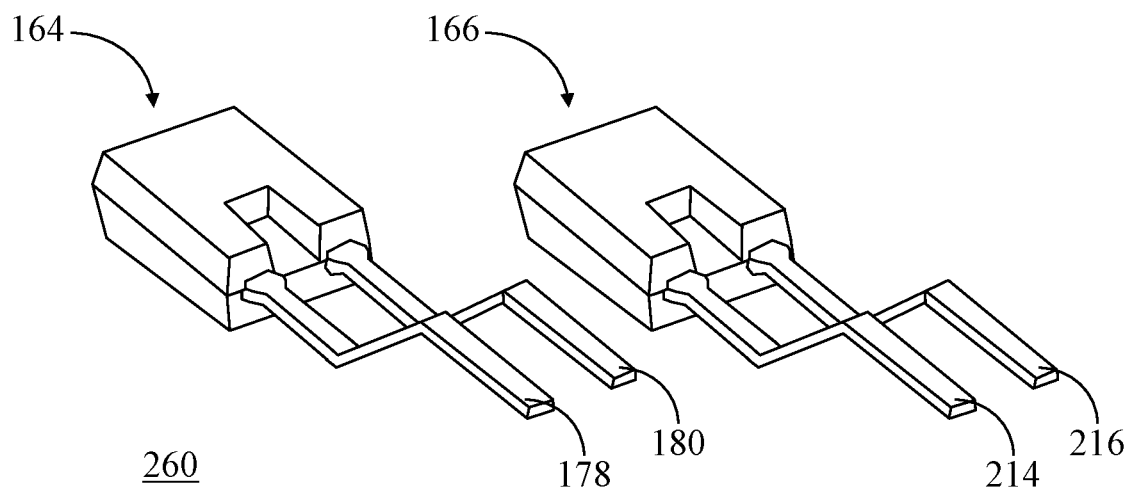
FIG. 22 shows a perspective view of the redundant sensor packages of FIGS. 18-20 at an initial stage of the sensor assembly fabrication process of FIG. 9.

FIG. 22 shows a perspective view of the redundant sensor packages of FIGS. 18-20 at an initial stage 260 of block 122 of sensor assembly fabrication process 120 (FIG. 9). In some embodiments, formation of a dual sensor/conductive structure subassembly may entail suitably bending first, second, third, and fourth connector pins 178, 180, 214, 216. First, second, third, and fourth connector pins 178, 180, 214, 216 are configured to be coupled, soldered, or otherwise attached to corresponding conductors of an electrically conductive structure. Thereafter, the conductors may be received in receiving features 258 of pin support 248 during overmolding. Accordingly, first, second, third, and fourth connector pins 178, 180, 214, 216 are bent to facilitate positioning of the conductors in receiving features 258 and to ensure that first and second alignment bars 252, 254 of alignment assembly 246 securely seat in respective first and second notch regions 202, 238.

Figure 23:
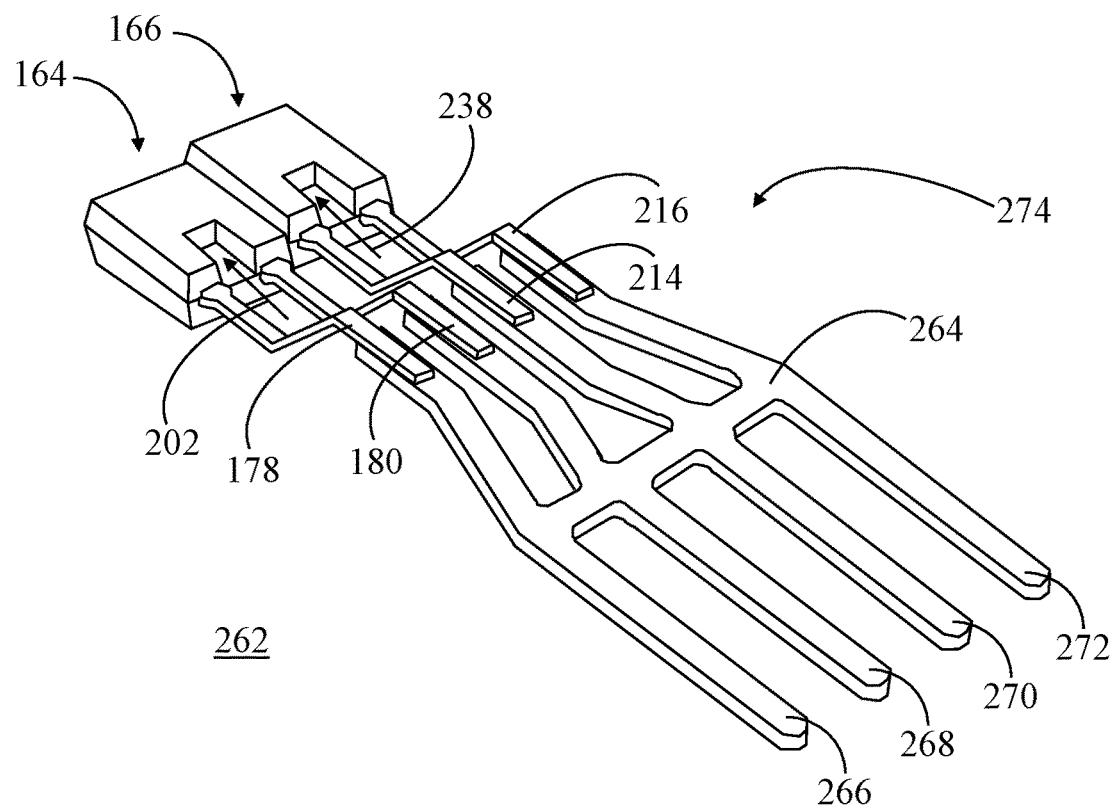
FIG. 23 shows a perspective view of the redundant sensor packages of FIG. 22 at a subsequent stage of the sensor assembly fabrication process.

FIG. 23 shows a perspective view of the redundant sensor packages (e.g., first and second sensor packages 164, 166) at a subsequent stage 262 of forming block 122 of sensor assembly fabrication process 120 (FIG. 9). At subsequent stage 262, first and second sensor packages 164, 166 may be welded or otherwise suitably coupled with a frame structure 264 such that first and second connector pins 178, 180 of first sensor package 164 are coupled with first and second conductors 266, 268 of frame structure 264 and such that third and fourth connector pins 214, 216 of second sensor package 166 are coupled with third and fourth conductors 270, 272 of frame structure 264. Thus, a dual sensor/frame structure subassembly 274 is formed.

Figure 24:
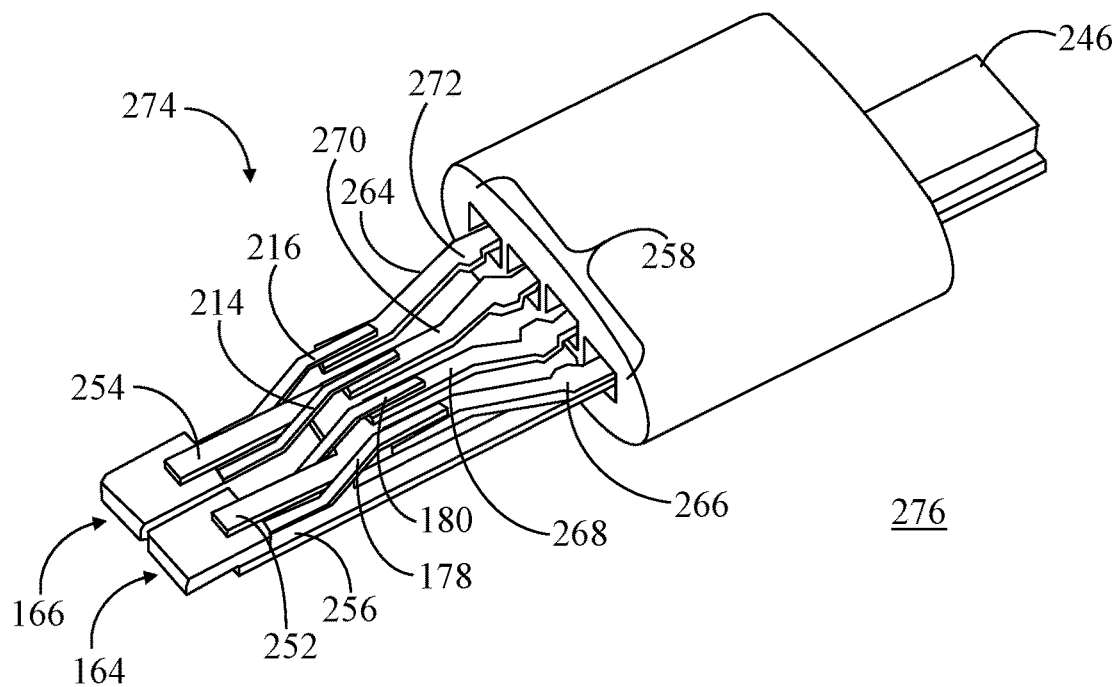
FIG. 24 shows a perspective view of the redundant sensor packages of FIG. 23 at a subsequent stage of the sensor assembly fabrication process.

FIG. 24 shows a perspective view of the redundant sensor packages (e.g., dual sensor/frame structure subassembly 274) at a subsequent stage 276 of sensor assembly fabrication process 120 (FIG. 9). More particularly, subsequent stage 276 represents the operations associated with block 132 of process 120. As shown, dual sensor/frame structure subassembly 274 is placed in alignment tool 244. First, second, third, and fourth conductors 178, 180, 214, 216 are inserted into receiving features 258 of pin support 248. Additionally, first alignment bar 252 of alignment tool 244 is received in first notch region 202 (FIG. 23) of first sensor package 164 and second alignment bar 254 of alignment tool 244 is received in second notch region 238 (FIG. 23) of second sensor package 166 of alignment tool 244. Platform region 256 is placed against second surface 192 of first housing 188 of first sensor package 164 and concurrently against fourth surface 228 of second housing 224 of second sensor package 166. Thus, alignment tool 244 can be utilized to securely retain first and second sensor packages 164, 166 in a cavity (e.g., cavity 144, FIG. 14) of a mold tool (e.g., mold tool 140, FIG. 14) during an overmolding process to yield a dual sensor assembly (e.g., sensor assembly 80, FIG. 6). Furthermore, first and second sensor packages 164, 166 are positioned adjacent to one another (e.g., side-by-side), but in a laterally displaced position relative to one another such that their respective sensing axes 240, 242 (FIG. 20) are laterally displaced from one another and extend parallel to one another.

The remaining operations of sensor assembly fabrication process 120 can thereafter be executed including retaining a retainer ring component in the cavity of the mold tool (block 134), executing an initial phase of the overmolding process to secure first and second sensor packages 164, 166 in the cavity (block 150), retracting first and second alignment bars 252, 254 away from first and second sensor packages 164, 166 (block 152), executing a subsequent phase of the overmolding process to fill the mold cavity (block 154), removing first and second alignment bars 252, 254 of alignment tool 244 from the resulting dual sensor assembly (block 156), and removing the dual sensor assembly from the mold tool (block 158).

Hence, FIGS. 1-8 and 10-17 demonstrate a configuration in which the first and second notch regions are formed in the alignment bar itself such that the first and second sensor packages are retained in the notch regions extending in the alignment bar of the alignment tool. Conversely, FIGS. 18-24 demonstrate a configuration in which the first and second notch regions are formed in the respective first and second housings of the first and second sensor packages are retained by seating the first and second bars of the alignment tool in the respective first and second notch regions. In either instance, the sensor assembly fabrication process 120 may be implemented to fabricate the dual sensor assembly.

Figure 25:
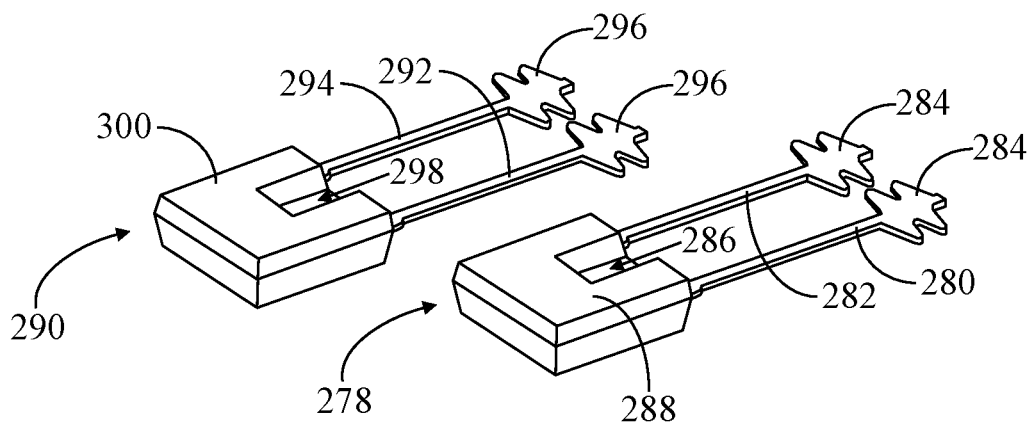
FIG. 25 shows a perspective view of redundant sensor packages in accordance with another embodiment.

FIG. 25 shows a perspective view of redundant sensor packages in accordance with another embodiment. The previous embodiments implemented a substantially rigid frame structure for electrical connection to the sensor packages. However, in some embodiments, a cable may be utilized for direct electrical connection to the sensor packages in lieu of the frame structure. As such, FIG. 25 shows a first sensor package 278 having first and second connector pins 280, 282 each of which is equipped with crimp baskets 284. In some embodiments, a first notch region 286 is positioned between first and second connector pins 280, 282 and extends into a first housing 288 of first sensor package 278. Likewise, FIG. 25 shows a second sensor package 290 having third and fourth connector pins 292, 294, each of which is equipped with crimp baskets 296. A second notch region 298 is positioned between third and fourth connector pins 292, 294 and extends into a second housing 300 of second sensor package 290. The internal components of first and second sensor packages 278, 290 may be similar to those described above in connection with FIGS. 18-19. Hence, their description will not be repeated herein for brevity.

Figure 26:
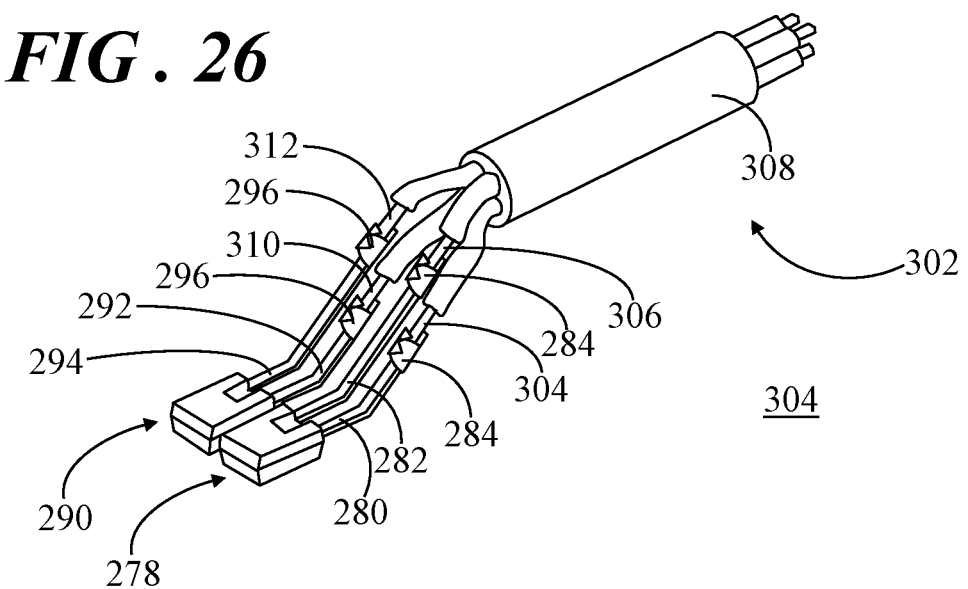
FIG. 26 shows a sensor/cable subassembly formed in accordance sensor assembly fabrication process 120 of FIG. 9 that incorporates the redundant sensor packages of FIG. 25.

FIG. 26 shows a sensor/cable subassembly 302 formed in accordance with block 122 of sensor assembly fabrication process 120 (FIG. 9) that incorporates first and second sensor packages 278, 290. Formation of sensor/cable subassembly 302 may entail suitably bending first and second connector pins 280, 282 and utilizing crimp baskets 284 to couple first and second connector pins 280, 282 to first and second cable conductors 304, 306 of a cable 308. Additionally, formation of sensor/cable subassembly 302 may entail suitably bending third and fourth connector pins 292, 294 and utilizing crimp baskets 296 to couple third and fourth connector pins 292, 294 to third and fourth cable conductors 310, 312 of cable 308. Thus, in some embodiments, crimp baskets 284, 296 are suitably bent or deformed to securely coupled first, second, third, and fourth connector pins 280, 282, 292, 294 to their respective first, second, third, and fourth cable conductors 304, 306, 310, 312. Although crimp baskets 284, 296 are shown as being part of first, second, third, and fourth connector pins 280, 282, 292, 294, in alternative embodiments, crimp baskets may be distinct parts that are used to couple the connector pins to the cable conductors.

Again, the remaining operations of sensor assembly fabrication process 120 can thereafter be executed including retaining a retainer ring component in the cavity of the mold tool (block 134), executing an initial phase of the overmolding process to secure first and second sensor packages 278, 290 in the cavity (block 150), retracting first and second alignment bars of a mold tool away from first and second sensor packages 278, 290 (block 152), executing a subsequent phase of the overmolding process to fill the mold cavity (block 154), removing the first and second alignment bars of the alignment tool from the resulting dual sensor assembly (block 156), and removing the dual sensor assembly from the mold tool (block 158).

Figure 27:
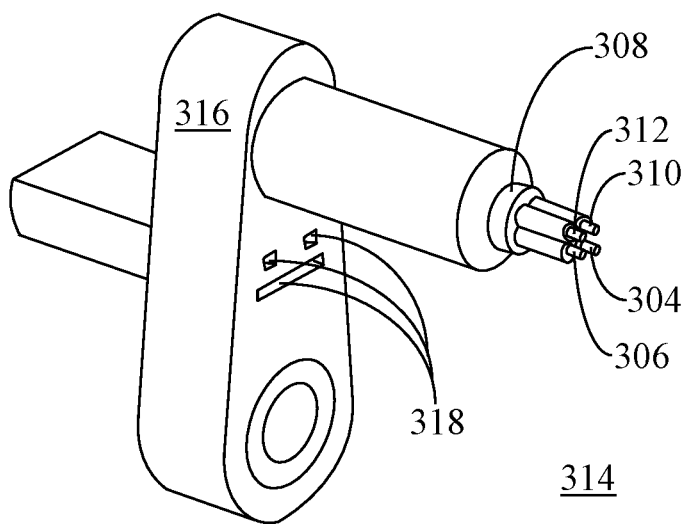
FIG. 27 shows a sensor assembly incorporating the redundant sensor packages of FIG. 25.

FIG. 27 shows a sensor assembly 314 incorporating the redundant sensor packages of FIG. 25 (e.g., first and second sensor packages 278, 290). In FIG. 27, first and second sensor packages 278, 290 and an end of cable 308 at the interconnection of first, second, third, and fourth connector pins 280, 282, 292, 294 with first, second, third, and fourth cable conductors 304, 306, 310, 312 are overmolded with an overmold material 316. Although not shown, in some embodiments overmold material 316 surrounding cable 308 may be formed with stress relief features to limit damage to cable 308 in an end-use application. Sensor assembly 314 may include markings 318 that remain in overmold material 316 following the removal of the alignment tool. Of course, in some embodiments, markings 318 may be suitably sealed with, for example, a potting compound to prevent or largely limit ingress of contaminants into the sensor assembly.

Accordingly, FIGS. 25-27 demonstrate a configuration in which the first and second notch regions are formed in the respective first and second housings of the first and second sensor packages. These sensor packages are retained by seating the first and second alignment bars of the alignment tool in the respective first and second notch regions. Additionally, FIGS. 25-27 demonstrate a configuration in which the electrically conductive structure that couples to the connector pins of the sensor packages is a cable. Further, the sensor assembly fabrication process 120 may be implemented to fabricate the dual sensor assembly.

Embodiments disclosed herein entail redundant sensor packages, dual sensor assemblies, and methodology for fabricating the sensor assemblies using a direct overmolding technique that does not require overmolding a support into the dual sensor assembly (e.g., forming a premolded support). In some embodiments, an alignment bar of an alignment tool includes a pair of notch regions in which the redundant sensor packages are seated during an overmolding process in a mold tool. In other embodiments, each of the sensor packages includes a notch region deep enough to accommodate an alignment bar of an alignment tool used with the mold tool. In either configuration, the redundant sensor packages may be held securely during the overmolding process, while ensuring that the sensitive area of each of the sensor packages (e.g., the reading point of the sensors) is close to the surface of the overmolded sensor assembly and the sensing axes of the sensor packages are laterally displaced from one another and extend parallel to one another. Further, the sensor package may be equipped with connector pins that may be connected with conductors of an electrically conductive structure, such as a rigid frame or a cable. This connection junction may also be overmolded with the overmold material for protection of the connection junction from an external environment. The various inventive concepts and principles embodied in the redundant sensor packages, sensor assemblies, and method of fabrication may thus enable improved fabrication and cost efficiency, as well as compact size and enhanced sensor reliability in a redundant sensor configuration.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A sensor assembly comprising:
a first sensor package including:
a first sensor die;
a first set of connector pins electrically connected to the first sensor die;
a first housing in which the first sensor die is located, the first housing having first and second surfaces spaced apart from one another by first, second, third, and fourth sidewalls; and
a first component positioned in proximity to the second surface of the first housing, wherein the first component is located outside of the first housing and is coupled to the second surface of the first housing;
a second sensor package adjacent to the first sensor package, the second sensor package including:
a second sensor die;
a second set of connector pins electrically connected to the second sensor die;
a second housing in which the second sensor die is located, the second housing having third and fourth surfaces spaced apart from one another by fifth, sixth, seventh, and eighth sidewalls; and
a second component positioned in proximity to the fourth surface of the second housing, wherein the second component is located outside of the second housing and is coupled to the fourth surface of the second housing, and wherein each of the first and second components is sized to reside in respective first and second notch regions in an alignment bar of an alignment tool, the alignment tool being configured to hold the first and second sensor packages in a mold tool during an overmolding process; and
an overmold material overmolded about the first and second sensor packages to form the sensor assembly.

2. The sensor assembly of claim 1 wherein the first and second sensor packages are directly overmolded with the overmold material without being attached to a carrier structure.

3. The sensor assembly of claim 1 wherein the first and second sensor packages are arranged side-by-side in a laterally displaced position such that their sensing axes extend parallel to one another.

4. The sensor assembly of claim 1 wherein the alignment bar of the alignment tool is configured to be retracted away from the first and second sensor packages following an initial phase of the overmolding process, the alignment bar is configured to be at least partially overmolded during a subsequent phase of the overmolding process, and the alignment bar is configured to be fully removed following the subsequent phase of the overmolding process such that a marking of the alignment bar remains in the overmold material.

5. The sensor assembly of claim 1 wherein:
the first sensor package further comprises a first die pad having first and second sides, the first side facing the first surface of the first housing and the second side facing the second surface of the first housing, wherein the first sensor die is coupled to the first side of the first die pad and the first component is coupled to the second side of the first die pad such that the first component is interposed between the second side of the first die pad and the second surface of the first housing; and
the second sensor package further comprises a second die pad having third and fourth sides, the third side facing the third surface of the second housing and the fourth side facing the fourth surface of the second housing, wherein the second sensor die is coupled to the third side of the second die pad and the second component is coupled to the fourth side of the second die pad such that the second component is interposed between the fourth side of the die pad and the fourth surface of the second housing.

6. A sensor assembly comprising:
a first sensor package including:
   a first sensor die;
   a first set of connector pins electrically connected to the first sensor die;
   a first housing in which the first sensor die is located, the first housing having first and second surfaces spaced apart from one another by first, second, third, and fourth sidewalls, wherein the first housing includes a first notch region extending into the first surface of the first housing such that a first material portion of the first housing is absent at the first sidewall and at the first surface of the first housing; and
   a first component positioned in proximity to the second surface of the first housing;
a second sensor package adjacent to the first sensor package, the second sensor package including:
   a second sensor die;
   a second set of connector pins electrically connected to the second sensor die;
   a second housing in which the second sensor die is located, the second housing having third and fourth surfaces spaced apart from one another by fifth, sixth, seventh, and eighth sidewalls; and
   a second component positioned in proximity to the fourth surface of the second housing, wherein the second housing includes a second notch region extending into the third surface of the second housing such that a second material portion of the second housing is absent at the fifth sidewall and at the third surface of the second housing; and
an overmold material overmolded about the first and second sensor packages to form the sensor assembly.

7. The sensor assembly of claim 6 wherein:
the first notch region is sized to receive a first alignment bar of an alignment tool;
the second notch region is sized to receive a second alignment bar of the alignment tool, the first and second alignment bars being configured to hold the first and second sensor packages in a mold tool during an overmolding process.

8. The sensor assembly of claim 6 wherein:
the first set of connector pins includes first and second connector pins extending from the first sidewall of the first housing, the first notch region being located between the first and second connector pins; and
the second set of connector pins includes third and fourth connector pins extending from the fifth sidewall of the second housing, the second notch region being located between the third and fourth connector pins.

9. The sensor assembly of claim 1 wherein:
the first set of connector pins includes first and second connector pins extending from the first sidewall of the first housing;
the second set of connector pins includes third and fourth connector pins extending from the fifth sidewall of the second housing; and
the sensor assembly further comprises an electrically conductive structure having a first conductor coupled to the first connector pin, a second conductor coupled to the second connector pin, a third conductor coupled to the third connector pin, and a fourth conductor coupled to the fourth connector pin, wherein an end of the electrically conductive structure at the interconnection of the first, second, third, and fourth conductors with the first, second, third, and fourth connector pins is overmolded with the overmold material.

10. The sensor assembly of claim 9 wherein the electrically conductive structure comprises a frame structure in which the first, second, third, and fourth conductors are substantially parallel to one another.

11. The sensor assembly of claim 9 wherein the electrically conductive structure comprises a cable having the first, second, third, and fourth conductors.

12. The sensor assembly of claim 1 wherein the first sensor die comprises a first magnetic field sensor, the second sensor die comprises a second magnetic field sensor, the first component comprises a first magnet, and the second component comprises a second magnet.

13. A method for forming a sensor assembly comprising:
retaining a first sensor package in a cavity of a mold tool, the retaining the first sensor package comprising receiving the first sensor package in a first notch region extending into an alignment bar of an alignment tool;
retaining a second sensor package in the cavity of the mold tool, the retaining the second sensor package comprising receiving the second sensor package in a second notch region extending into the alignment bar of the alignment tool, wherein the retaining the first and second sensor packages includes arranging the first and second sensor packages side-by-side such that their sensing axes are laterally displaced from one another and extend parallel to one another; and
performing an overmolding process to fill the cavity with an overmold material to form the sensor assembly, wherein the alignment bar is configured to hold the first and second sensor packages in the mold tool during the overmolding process such that the first and second sensor packages are directly overmolded with the overmold material without being attached to a carrier structure.

14. The method of claim 13 wherein the performing operation comprises:
executing an initial phase of the overmolding process to secure the first and second sensor packages in the mold tool with the overmold material;
retracting the alignment bar of the alignment tool away from the first and second sensor packages following the initial phase of the overmolding process; and
executing a subsequent phase of the overmolding process following the retracting operation, the subsequent phase being performed to fill the cavity of the mold tool with the overmold material.

15. The method of claim 13 wherein:
the first sensor package includes a first sensor die, a first set of connector pins electrically connected to the first sensor die, and a first housing in which the first sensor die is located, the first housing having first and second surfaces spaced apart from one another by first, second, third, and fourth sidewalls, wherein the first set of connector pins includes first and second connector pins extending from the first sidewall of the first housing;
the second sensor packages includes a second sensor die, a second set of connector pins electrically connected to the second sensor die, and a second housing in which the second sensor die is located, the second housing having third and fourth surfaces spaced apart from one another by fifth, sixth, seventh, and eighth sidewalls, wherein the second set of connector pins includes third and fourth connector pins extending form the fifth sidewall of the second housing; and the method further comprises:

prior to retaining the first sensor package, coupling the first and second connector pins to respective first and second conductors of an electrically conductive structure;

prior to retaining the second sensor package, coupling the third and fourth connector pins to respective third and fourth conductors of the electrically conductive structure; and retaining an end of the electrically conductive structure at the interconnection of the first, second, third, and fourth conductors with the first, second, third, and fourth connector pins in the cavity of the mold tool prior to performing the overmolding process.

16. A method for forming a sensor assembly comprising:

retaining a first sensor package in a cavity of a mold tool utilizing an alignment tool, the retaining the first sensor package including receiving a first alignment bar of the alignment tool in a first notch region extending into a first surface of a first housing of the first sensor package;

retaining a second sensor package in the cavity of the mold tool, the retaining the second sensor package including receiving a second alignment bar of the alignment tool in a second notch region extending into a second surface of a second housing of the second sensor package, wherein the retaining the first and second sensor packages includes arranging the first and second sensor packages side-by-side such that their sensing axes are laterally displaced from one another and extend parallel to one another; and performing an overmolding process to fill the cavity with an overmold material to form the sensor assembly, wherein the first and second alignment bars are configured to hold the first and second sensor packages in the mold tool during the overmolding process such that the first and second sensor packages are directly overmolded with the overmold material without being attached to a carrier structure.

17. The method of claim 16 wherein the performing operation comprises:

executing an initial phase of the overmolding process to secure the first and second sensor packages in the mold tool with the overmold material;

retracting the first and second alignment bars of the alignment tool away from the first and second sensor packages following the initial phase of the overmolding process; and executing a subsequent phase of the overmolding process following the retracting operation, the subsequent phase being performed to fill the cavity of the mold tool with the overmold material.

18. The method of claim 16 wherein:

the first sensor package includes a first sensor die, a first set of connector pins electrically connected to the first sensor die, and a first housing in which the first sensor die is located, the first housing having first and second surfaces spaced apart from one another by first, second, third, and fourth sidewalls, wherein the first set of connector pins includes first and second connector pins extending from the first sidewall of the first housing;

the second sensor packages includes a second sensor die, a second set of connector pins electrically connected to the second sensor die, and a second housing in which the second sensor die is located, the second housing having third and fourth surfaces spaced apart from one another by fifth, sixth, seventh, and eighth sidewalls, wherein the second set of connector pins includes third and fourth connector pins extending from the fifth sidewall of the second housing; and the method further comprises:

prior to retaining the first sensor package, coupling the first and second connector pins to respective first and second conductors of an electrically conductive structure;

prior to retaining the second sensor package, coupling the third and fourth connector pins to respective third and fourth conductors of the electrically conductive structure; and retaining an end of the electrically conductive structure at the interconnection of the first, second, third, and fourth conductors with the first, second, third, and fourth connector pins in the cavity of the mold tool prior to performing the overmolding process.

* * * * *